US009986663B2

(12) United States Patent
Broido et al.

(10) Patent No.: US 9,986,663 B2
(45) Date of Patent: May 29, 2018

(54) HIGH THERMAL CONDUCTIVITY MATERIALS FOR THERMAL MANAGEMENT APPLICATIONS

(71) Applicant: The United States of America, as represented by the Secretary of the Navy, Washington, DC (US)

(72) Inventors: David A. Broido, Needham, MA (US); Thomas L. Reinecke, Alexandria, VA (US); Lucas R. Lindsay, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 14/763,993

(22) PCT Filed: Jan. 29, 2014

(86) PCT No.: PCT/US2014/013650
§ 371 (c)(1),
(2) Date: Jul. 28, 2015

(87) PCT Pub. No.: WO2014/120807
PCT Pub. Date: Aug. 7, 2014

(65) Prior Publication Data
US 2015/0362265 A1 Dec. 17, 2015

Related U.S. Application Data

(60) Provisional application No. 61/758,020, filed on Jan. 29, 2013.

(51) Int. Cl.
*H05K 7/20* (2006.01)
*F28F 21/00* (2006.01)
(Continued)

(52) U.S. Cl.
CPC ......... *H05K 7/20481* (2013.01); *F16D 69/00* (2013.01); *F16D 69/02* (2013.01);
(Continued)

(58) Field of Classification Search
CPC .......... F28F 21/00; F16D 69/00; F16D 69/02; F16D 2066/001; F16D 2200/0047;
(Continued)

(56) References Cited

U.S. PATENT DOCUMENTS 3,413,092 A * 11/1968 Williams ................ C22C 1/007
252/584
4,833,103 A * 5/1989 Agostinelli ......... C23C 18/1204
117/9

(Continued)

OTHER PUBLICATIONS

Lindsay, Broido, Reinecke; First-Principles Determination of Ultra-high Thermal Conductivity of Boron Arsenide: A competitor for Diamond?; Physical Review Letters (PRL 111, 025901 (2013)).*

(Continued)

*Primary Examiner* — Zachary M Pape
(74) *Attorney, Agent, or Firm* — U.S. Naval Research Laboratory; Joslyn Barritt

(57) ABSTRACT

High thermal conductivity materials and methods of their use for thermal management applications are provided. In some embodiments, a device comprises a heat generating unit (304) and a thermally conductive unit (306, 308, 310) in thermal communication with the heat generating unit (304) for conducting heat generated by the heat generating unit (304) away from the heat generating unit (304), the thermally conductive unit (306, 308, 310) comprising a thermally conductive compound, alloy or composite thereof. The thermally conductive compound may include Boron Arsenide, Boron Antimonide, Germanium Carbide and Beryllium Selenide.

5 Claims, 32 Drawing Sheets

(51) Int. Cl.
*H01L 23/373* (2006.01)
*F16D 69/00* (2006.01)
*F16D 69/02* (2006.01)
*F16D 66/00* (2006.01)

(52) U.S. Cl.
CPC .......... *F28F 21/00* (2013.01); *H01L 23/3731* (2013.01); *H01L 23/3738* (2013.01); *H05K 7/20509* (2013.01); *F16D 2066/001* (2013.01); *F16D 2200/0047* (2013.01); *H01L 2924/0002* (2013.01)

(58) Field of Classification Search
CPC ............. H01L 23/3731; H01L 23/3738; H01L 2924/0002; H05K 7/2039; H05K 7/20509
See application file for complete search history.

(56) References Cited

U.S. PATENT DOCUMENTS

| | | | | |
|---|---|---|---|---|
| 6,900,143 | B1* | 5/2005 | Pan | H01L 21/28525 257/347 |
| 9,287,112 | B2* | 3/2016 | Stuart | H01S 3/08095 |
| 2005/0287786 | A1* | 12/2005 | Gammel | H01L 21/322 438/618 |
| 2007/0047253 | A1* | 3/2007 | Lee | G02B 5/08 362/561 |
| 2007/0195608 | A1* | 8/2007 | Forbes | H01L 29/42324 365/185.28 |
| 2011/0062578 | A1* | 3/2011 | Katagiri | H01L 21/6835 257/712 |

OTHER PUBLICATIONS

Donald T. Morelli, et al., "High Lattice Thermal Conductivity Solids," in High Conductivity Materials (2005), pp. 37-68.
G.A. Slack, "Nonmetallic Crystals with High Thermal Conductivity," J. Phys. Chem. Solids, 1973. vol. 34, pp. 321-335.
A. Jeżowski et al., "Thermal conductivity of GaN crystals grown by high pressure method," Physica Status Solidi B, vol. 240, pp. 447-450 (2003).
R. K. Kremer et al., "Thermal conductivity of isotopically enriched 28Si: revisited," Solid State Communications, vol. 131 (2004), pp. 499-503.
V. M. Muzhdaba et. al, "Thermal Conductivity and Thermo-EMF of AlSb and GaP at Low Temperatures," Sov. Phys. Solid State, vol. 10, pp. 2265-2267, 1968.
L. Lindsay, D. A. Broido, and T. L. Reinecke, "First-Principles Determination of Ultrahigh Thermal Conductivity of Boron Arsenide: A Competitor for Diamond?" Phys. Rev. Lett. 111, 025901 (Jul. 2013).

* cited by examiner

Table 1

| | $M_{av}$ (amu) | $\Theta_a$ (K) | $\Theta_{BO}$ (K) (with K/C=1) | $\Theta_{BO}$ (K) (with K/C=2) | P |
|---|---|---|---|---|---|
| c-BN | 12.41 | 2025 | 940 | 2145 | 130 |
| BAs | 42.87 | 700 | 2240 | 3170 | 40 |
| BSb | 66.28 | 495 | 465 | 1180 | 155 |
| diamond | 12.01 | 2280 | 2305 | 3440 | 50 |
| Si | 28.09 | 710 | 145 | 155 | 7 |
| Ge | 72.59 | 415 | 60 | 75 | 23 |
| GeC | 42.31 | 797 | 277 | 1517 | 448 |
| BeSe | 43.99 | 496 | 115 | 633 | 450 |

FIG. 5

Table 2

| | M/m | scattering time | a-a scattering | bunching | a-o scattering | Isotopically pure heavy atom |
|---|---|---|---|---|---|---|
| c-BN | 1.30 | 0 | present | present | weak | N/A |
| BP | 2.87 | 0.36 | present | present | weak | N/A |
| BAs | 6.93 | 0.97 | absent | present | weak | yes |
| BSb | 11.26 | 1.42 | absent | present | weak | no |
| diamond | 1 | 0 | present | present | weak | N/A |
| Si | 1 | 0 | present | absent | strong | N/A |
| Ge | 1 | 0 | present | absent | strong | N/A |
| GeC | 6.05 | 0.78 | Almost absent | present | weak | no |
| BeSe | 8.76 | 1.07 | absent | present | weak | no |

FIG. 7

Table 3

| | AW(m) (amu) | a(Å) (a₀) | B (GPa) | C (J/mol·K) | κ (W/m·K) | ν | θ_D (K) |
|---|---|---|---|---|---|---|---|
| w-BeO | 9.01 (16.00) | - (0.33) | 1152ᵃ | 433ᵃ | 422ᵃ | 1.17ᵃ | 3ᵃ (2) |
| BeS | 9.01 (32.06) | - (1.68) | 759 | 195 | 176 (170) | 1.13 | 11 (10) |
| BeSe | 9.01 (78.96) | - (4.62) | 496 | 633 | 115 (108) | 1.48 | 450 (319) |
| BeTe | 9.01 (127.60) | - (2.83) | 361 | 371 | 102 (96) | 1.45 | 264 (190) |
| GeC | 72.59 (12.01) | 5.87 (0.75) | 797 | 1517 | 277 (268) | 1.38 | 448 (319) |
| c-SiC | 28.09 (12.01) | 2.01 (0.75) | 1244 | 572 | 479 (480) | 1.07 | 20 (17) |
| diamond | 12.01 (12.01) | 0.75 (0.75) | 2280 | 3450 | 2290 | 1.49 | 50 (25) |
| c-BN | 10.81 (14.01) | 13.7 (-) | 2027 | 2146 | 942 (1393) | 1.46 | 128 (72) |
| BSb | 10.81 (121.75) | 13.7 (0.66) | 494 | 1183 | 467 (466) | 1.59 | 153 (98) |
| w-GaN | 69.72 (14.01) | 1.97 (-) | 624ᵃ | 401ᵃ | 242ᵃ | 1.07ᵃ | 66ᵃ (62) |

FIG. 21

HIGH THERMAL CONDUCTIVITY MATERIALS FOR THERMAL MANAGEMENT APPLICATIONS

RELATED APPLICATIONS

This application is a national phase filing under 35 U.S.C. 371 of International Application No. PCT/US2014/013650, filed Jan. 29,2014, which claims the benefit of and priority to U.S. Provisional Application Ser. No. 61/758,020, filed Jan 29, 2013, which applications are incorporated herein by reference in their entireties.

STATEMENT OF GOVERNMENT SUPPORT

This invention was made with Government Support under Contract Number 1066634 awarded by the United States National Science Foundation, and under contract Number DE-FG02-09ER46577 awarded by the United States Department of Energy. The Government has certain rights in the invention.

FIELD

The embodiments disclosed herein relate to high thermal conductivity materials and their use for thermal management applications.

BACKGROUND

The ability to produce and to understand materials with high thermal conductivities is becoming increasingly important. As microelectronic devices become smaller, faster and more powerful, thermal management is becoming a critical challenge in, e.g., microprocessors, light emitting diodes (LEDs) and high power radio frequency (RF) devices. Carbon based materials, including diamond and graphite, have long been recognized as having the highest thermal conductivities, $\kappa$, of any bulk material with room temperature (RT) values for diamond and graphite with naturally occurring carbon isotope mixtures of around 2000 $Wm^{-1}K^{-1}$. Other high thermal conductivity materials, such as copper are not even close, having $\kappa$ four to five times smaller. However, diamond is scarce and its synthetic fabrication suffers from slow growth rates, high cost and low quality. Thus, there is a need to identify new materials with ultra-high thermal conductivities that are less expensive and are easier to fabricate than diamond based materials, as well as other materials used for thermal management applications.

SUMMARY

The present disclosure provides unconventional high thermal conductivity materials for thermal management applications.

According to some aspects illustrated herein, there is provided a device comprising a heat generating unit and a thermally conductive unit in thermal communication with the heat generating unit for conducting heat generated by the heat generating unit away from the heat generating unit, the thermally conductive unit comprising a thermally conductive compound, alloy or composite thereof.

According to some aspects illustrated herein, there is provided a method for dissipating heat comprising fabricating a thermally conductive unit at least in part from a thermally conductive compound, alloy or composite thereof, and positioning the thermally conductive unit in thermal communication with a heat generating unit so that when the heat generating unit generates heat, the thermally conductive unit conducts the heat away from the heat generating unit.

According to some aspects illustrated herein, there is provided an electronic device comprising a heat spreader having a first side and a second side opposite the first side; a heat generating unit disposed on the first side of the heat spreader in thermal communication with the heat spreader; and a heat sink disposed on the second side of the heat spreader in thermal communications with the heat spreader, wherein at least one of the heat spreader and the heat sink comprise a thermally conductive compound, alloy or composite thereof.

According to some aspects illustrated herein, there is provided a method of heat dissipating comprising heating a thermally conductive unit comprising a thermally conductive compound, alloy or composite thereof and allowing the thermally conductive unit to dissipate heat.

In some embodiments, the thermally conductive compound comprises one or more light atoms selected from the group consisting of Beryllium, Boron, Carbon, or Nitrogen and a heavy atom which is between about 4 and about 17 times heavier than the light atom. In some embodiments, the heavy atom is selected from the group consisting of Germanium (Ge), Arsenic (As), Antimony (Sb), Selenium (Se). In some embodiments, the thermally conductive compound is selected from the group consisting of Boron Arsenide (BAs), Boron Antimonide (BSb), Germanium Carbide (GeC) and Beryllium Selenide (BeSe). In some embodiments, the thermally conductive compound is Boron Arsenide (BAs). In some embodiments, the heavy atom of the thermally conductive compound is at least about 70% isotopically pure. In some embodiments, the heavy atom of the thermally conductive compound is at least about 90% isotopically pure.

BRIEF DESCRIPTION OF THE DRAWINGS

The presently disclosed embodiments will be further explained with reference to the attached drawings, wherein like structures are referred to by like numerals throughout the several views. The drawings shown are not necessarily to scale, with emphasis instead generally being placed upon illustrating the principles of the presently disclosed embodiments.

FIG. 5 presents Table 1 showing low average atomic mass ($M_{avg}$) and calculated $\theta_D$, RT thermal conductivity of materials with naturally occurring isotope mixtures ($\kappa_{nat}$) and thermal conductivity of isotopically pure materials ($\kappa_{pure}$), and percent enhancement to $\kappa$ with isotopic purification given by $P=100\times(\kappa_{pure}/\kappa_{nat}-1)$.

FIG. 7 presents Table 2 showing mass ratio of the compounds discussed herein, (the mass ratio of the elemental materials is 1), calculated a-o frequency gap scaled by the maximum acoustic phonon frequency (no aao scattering can occur for values larger than 1); presence or absence of aao scattering and bunching; relative strength of aaa scattering in the higher frequency range of the acoustic phonon spectrum of each material, and presence or absence of an isotopically pure heavy atom.

FIG. 21 presents Table 3 listing atomic masses, mass variance parameter ($g_k$), and calculated $\theta_D$ for various materials.

Figure 1:
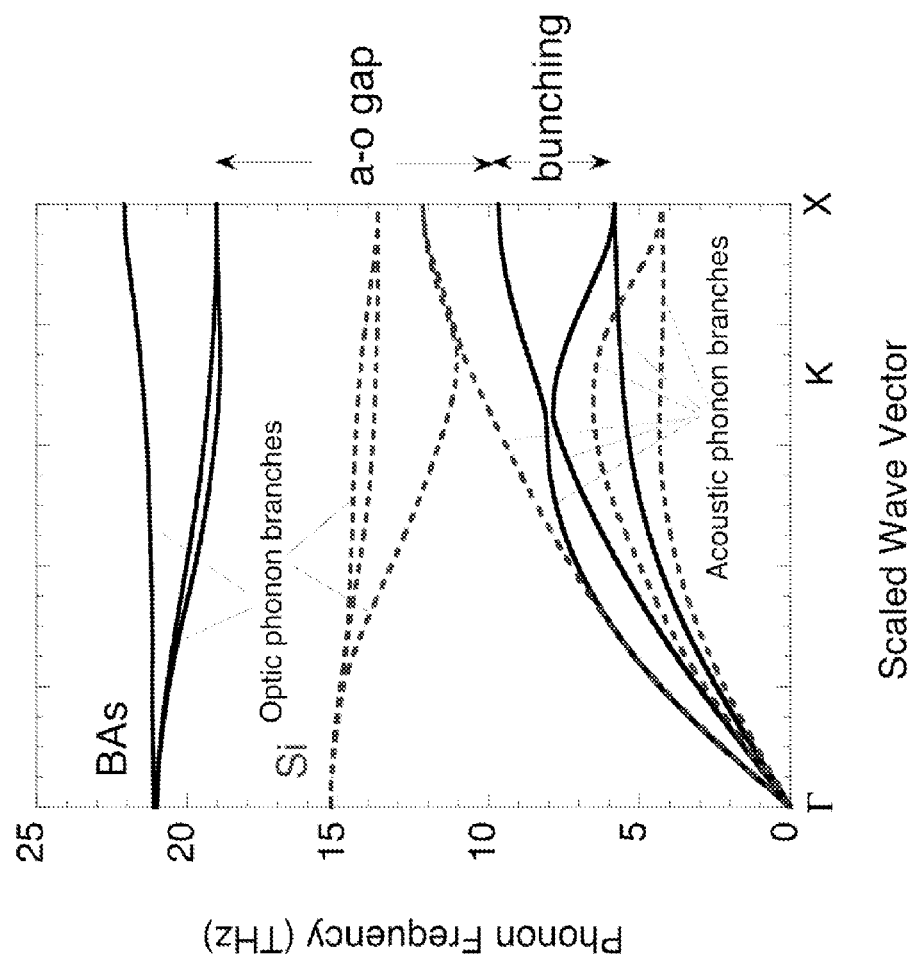
FIG. 1 shows a portion of the phonon dispersion of Boron Arsenide compared to that of Silicon (Si) along the Γ-K-X direction.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The present disclosure describes unconventional high thermal conductivity compounds, and alloys and composites thereof for use in thermal management applications. The term "alloy" as used herein refers to a mixture or solid solution of several of the unconventional high thermal conductivity compounds of the present disclosure or of one or more of these with one or more additional elements. In some embodiments, the high thermal conductivity compounds of the present disclosure may be mixed with metals such as aluminum or copper to tailor the coefficient of thermal expansion (CTE) of the alloy. The term "composite" as used herein refers to the high thermal conductivity compounds of the present disclosure or alloys thereof combined with or embedded in one or more matrix materials. Examples of suitable matrix materials include, but are not limited to, epoxy resin, rubber, ceramic, plastics, semiconductor materials, such as, for example, Gallium Nitride (GaN) or Aluminum Nitride (AlN), or combinations thereof. Through use of composites of the high thermal conductivity compounds of the present disclosure or alloys thereof, the composite material can be tailored to better match requirements of specific thermal management applications such as the CTE of the heat generating device.

Commonly accepted criteria to guide choices of high thermal conductivity (κ) non-metallic compounds include: 1) simple crystal structure, 2) low average atomic mass, $M_{avg}$, 3) strong interatomic bonding, and 4) low anharmonicity. Items 2) and 3) imply a large Debye temperature, $\theta_D$, and give the frequently used rule of thumb that κ decreases with increasing $M_{avg}$ and with decreasing $\theta_D$.

However, Inventors have identified a new paradigm to achieve high thermal conductivity in an unconventional way. In addition to the commonly accepted criteria described above, Inventors have discovered three additional criteria that can increase thermal conductivity, including: 1) a large mass ratio of constituent atoms; 2) A bunching together of the acoustic phonon dispersions; and 3) isotopically pure heavier atom. The combination of these properties results in much weaker intrinsic thermal resistance over a wide temperature range and, in particular around room temperature, than would be expected based on only the conventional criteria. For example, based on the conventional criteria, Boron Arsenide (BAs) would have a RT κ of around 200 Wm$^{-1}$K$^{-1}$, comparable to silicon and ten times smaller than that of diamond. However, when taking into account the newly-discovered criteria, BAs with naturally occurring isotope concentration may have a room temperature thermal conductivity over 2000 Wm$^{-1}$K$^{-1}$ comparable to that of diamond, and isotopically pure BAs may have a room temperature thermal conductivity over 3000 Wm$^{-1}$K$^{-1}$, comparable to that of isotopically pure diamond. In comparison, room temperature thermal conductivity of the Carbon based materials, diamond and graphite, with natural Carbon isotope mix is about 2000 Wm$^{-1}$K$^{-1}$, and room temperature thermal conductivity of other materials such as metals, copper and silver, or insulator silicon carbide, which are commonly used for thermal management applications, is only in the range of 200 Wm$^{-1}$K$^{-1}$ to 500 Wm$^{-1}$K.

The newly-discovered paradigm enables identifying new unconventional high thermal conductivity materials, which would not be expected to have high thermal conductivity based only on the conventional criteria. The high thermal conductivity compounds of the present disclosure include compounds that meet some or all of the three unconventional criteria and, to a degree, meet some aspects of the conventional criteria.

In some embodiments, the high thermal conductivity compounds of the present disclosure may have one or two light atoms in combination with a sufficiently or relatively heavier atom. In some embodiments, there is only one heavy atom. Such combination of one or more light atoms with a heavier atom may provide a large frequency gap between acoustic and optic phonons (a-o gap). A sufficiently large a-o gap removes much of the intrinsic thermal resistance due to anharmonic scattering between acoustic and optic phonons. In some embodiments, the heavier atom may be between 4 and 17 times heavier than the light atom, which may eliminate the anharmonic scattering between acoustic and optic phonons. In some embodiments, the heavier atom may be at least five times heavier than the light atom. In some embodiments, the heavier atom may be between 6 and 12 times heavier than the light atom, which may eliminate the anharmonic scattering between acoustic and optic phonons. By way of non-limiting examples, in BAs, As atoms are about seven times heavier than B atoms in BAs; in BSb, Sb atoms are about eleven times heavier than B atoms in BSb; in GeC, Ge atoms are about six times heavier than C atoms in GeC; and in BeSe, Se atoms are almost nine times heavier than Be atoms in BeSe. Moreover, in reference to FIG. 1, the seven times difference in weight between As atoms (heavy) and B atom (light) in BAs may produce a large gap between acoustic and optic phonon branches (a-o gap). This is evident from FIG. 1, which shows a portion of the phonon dispersion of BAs compared to that of silicon (Si) along the Γ-K-X direction.

In some embodiments, the heavier atom may be isotopically pure, as discussed in more detail below. For large atomic mass ratio compounds the motion of the heavy atoms dominates for the heat-carrying acoustic phonon modes. Compounds having isotopically pure heavy atoms may show significantly weaker phonon-isotope scattering than those with heavy atoms having large isotope mixtures.

In some embodiments, the one or more light atoms may be one or more of Beryllium, Boron, Carbon, or Nitrogen. Bunching together of the acoustic phonon dispersions can occur in compound materials where one or more constituent atoms are Beryllium, Boron, Carbon or Nitrogen due to the unusual nature of the atomic bonds. This may remove intrinsic thermal resistance due to anharmonic scattering between acoustic phonons. Suitable heavier atoms include, but are not limited to, Germanium (Ge), Gallium (Ga), Arsenic (As), Antimony (Sb), Selenium (Se), Vanadium (V), Yttrium (Y), Niobium (Nb), Tantalum (Ta), Chromium (Cr), Molybdenum (Mo), and Zirconium (Zr). In some embodiments, the relatively heavier atom may be selected from Germanium (Ge), Arsenic (As), Antimony (Sb), Selenium (Se).

In some embodiments, the unconventional high thermal conductivity compounds of the present disclosure have a high thermal conductivity ($\kappa$) at room temperature and include, but are not limited to, Boron Arsenide (BAs), Boron Antimonide (BSb), Germanium Carbide (GeC) and Beryllium Selenide (BeSe), for thermal management applications. Moreover, it has been discovered that some high thermal conductivity compounds of the present disclosure, and particularly, BAs and BAs based materials, may have a low coefficient of thermal expansion comparable to that of silicon.

In some embodiments, the high thermal conductivity compounds of the present disclosure are boron based cubic compounds, and in particular, Boron based III-V compounds, such as, without limitation, Boron Nitride (BN), Boron Phosphate (BP), Boron Arsenide (BAs), and Boron Antimonide (BSb).

In some embodiments, the present disclosure provides BAs, alloys of BAs, and composites thereof for thermal management applications. BAs meets all three unconventional criteria for compounds with high thermal conductivity, as well as conventional criteria 1) and 4). Although it does not meet conventional criteria 2) and 3) as well as does diamond, it meets criteria 2) and 3) to a sufficient degree that, along with the other conventional and new criteria it satisfies, still give BAs exceptionally high thermal conductivity. Thus, as described above, the actual thermal conductivity of BAs is at least ten times greater than what would be expected from the conventional criteria.

In some embodiments, the thermal conductivity of the unconventional high thermal conductivity compounds (including, without limitations, BAs, BSb, GeC and BeSe) may be further enhanced by isotopic purification of the constituent elements making up the relevant compounds. In many materials the constituent atoms have naturally occurring isotope mixtures, and these act as impurities that may reduce $\kappa$. The amount of the reduction depends on the thermal resistance produced by the isotopes compared to the intrinsic thermal resistance. In BAs and BSb, the natural Boron isotope mixture is 19.9% $^{10}$B and 80.1% $^{11}$B. The term "isotopically pure" as used herein refers to compounds having isotopes of only one type for each constituent atom. In some embodiments, the high thermal conductivity compounds of the present disclosure are at least 70% isotopically pure. In some embodiments, the high thermal conductivity compounds of the present disclosure are at least 80% isotopically pure. In some embodiments, the high thermal conductivity compounds of the present disclosure are at least 90% isotopically pure. In some embodiments, the high thermal conductivity compounds of the present disclosure are at least 99% isotopically pure. In some embodiments, the high thermal conductivity compounds of the present disclosure are 100% isotopically pure.

For BAs, the anion element is substantially pure, As in BAs is almost 100% pure $^{75}$As. However, for naturally occurring BSb, the Sb mixture is about 57% $^{121}$Sb and 43% $^{123}$Sb. By way of reference, in naturally occurring BSb, the actual Boron mix is 19.9% $^{10}$B and 80.1% $^{11}$B and the Sb mixture is about 57% $^{121}$Sb and 43% $^{123}$Sb. The calculated BSb thermal conductivity for that case is 465 Wm$^{-1}$K$^{-1}$ at room temperature. By way of reference, in naturally occurring GeC, the actual C mix is 98.9% $^{12}$C and 1.1% $^{13}$C and the Ge mixture is about 20.8% $^{70}$Ge, 27.5% $^{72}$Ge, 7.7% $^{73}$Ge, 36.3% $^{74}$Ge and 7.6% $^{76}$Ge. The calculated GeC thermal conductivity for that case is 277 Wm$^{-1}$K$^{-1}$ at room temperature. By way of reference, in naturally occurring BeSe, the actual Be mix is 100% $^{9}$Be, and the Se mixture is about 0.8% $^{74}$Se, 9.4% $^{76}$Se, 7.6% $^{77}$Se, 23.8% $^{78}$Se, 49.6% $^{80}$Se, and 8.7% $^{82}$Se. The calculated BeSe thermal conductivity for that case is 115 Wm$^{-1}$K$^{-1}$ at room temperature. In comparison, for example, BAs with naturally occurring isotope concentration may have a room temperature thermal conductivity over 2000 Wm$^{-1}$K$^{-1}$ comparable to that of diamond, and isotopically pure BAs may have a room temperature thermal conductivity over 3000 Wm$^{-1}$K$^{-1}$, comparable to that of isotopically pure diamond. Isotopically pure BSb may have a room temperature thermal conductivity over 1100 Wm$^{-1}$K$^{-1}$. Isotopically pure GeC may have room temperature thermal conductivity over 1500 Wm$^{-1}$K$^{-1}$. Isotopically pure BeSe may have room temperature thermal conductivity over 600 Wm$^{-1}$K$^{-1}$.

In some embodiments, the high thermal conductivity compounds include a heavy atom that is at least 70%, at least 80%, at least 90%, at least 99% or 100% isotopically pure. In regard to BAs, the room temperature intrinsic $\kappa$, $\kappa_{pure}$, of BAs is over 3000 Wm$^{-1}$K$^{-1}$. As noted above, many materials have naturally occurring isotope mixtures, which act as impurities that reduce $\kappa$. The discussion above predicts that the intrinsic thermal resistance in BAs is small. Therefore, one might expect that the natural isotope mix of Boron in BAs to significantly reduce its $\kappa$, but it is not the case with BAs. As a result of the large As to B mass ratio, for the shorter wavelength acoustic phonons that provide the dominant contributions to the BAs thermal conductivity, the Boron atoms hardly vibrate. The heavy As atoms vibrate significantly; however, they are isotopically pure. This makes the thermal resistance due to isotopes in BAs relatively weak and results in a high $\kappa$ in BAs despite having a large naturally occurring Boron isotope mixture. At room temperature, the $\kappa$ for BAs with the natural isotope mix, $\kappa_{nat}$, is reduced only by about ⅓ of $\kappa_{pure}$ and so is still over 2000Wm$^{-1}$K$^{-1}$, comparable to the $\kappa_{nat}$ of diamond.

Due to their favorable thermal conductivity and coefficient of thermal expansion (CTE), the unconventional high thermal conductivity compounds of the present disclosure, and BAs in particular, their alloys and composites thereof may be used in a number of thermal management applications. The high thermal conductivity materials of the present disclosure may be presented as sheets, powders, particles, films, coatings, wires, or similar shapes. In some embodiments, the materials may be macroscopic, microscopic or nanoscopic. In some embodiments, the materials may be within the composite matrix of a different material. The high thermal conductivity materials of the present disclosure may be synthesized by a variety of methods known in the art, including, but not limited to, molecular beam epitaxy (MBE), chemical vapor deposition (CVD), pulsed laser deposition (PLD), physical vapor deposition (PVD). In some embodiments, appropriate quantities of Y and X elements where Y is B, Ge or Be and X is As, Sb, C or Se may be heated in a sealed evacuated tube composed of appropriate material (for example, quartz or silica) at appropriate temperature and pressure. In some embodiments, Y powder (where Y is B, Ge or Be) with an excess of X element where X is As, Sb, C or Se may be heated in a sealed, evacuated tube composed of appropriate material may be heated to appropriate temperature at appropriate pressure. (For BAs, see e.g., Wang et al, Synthesis and Characterization of a p-Type Boron Arsenide Photoelectrode, J. Am. Chem. Soc. 2012, 134, 11056-11059).

Figure 2:
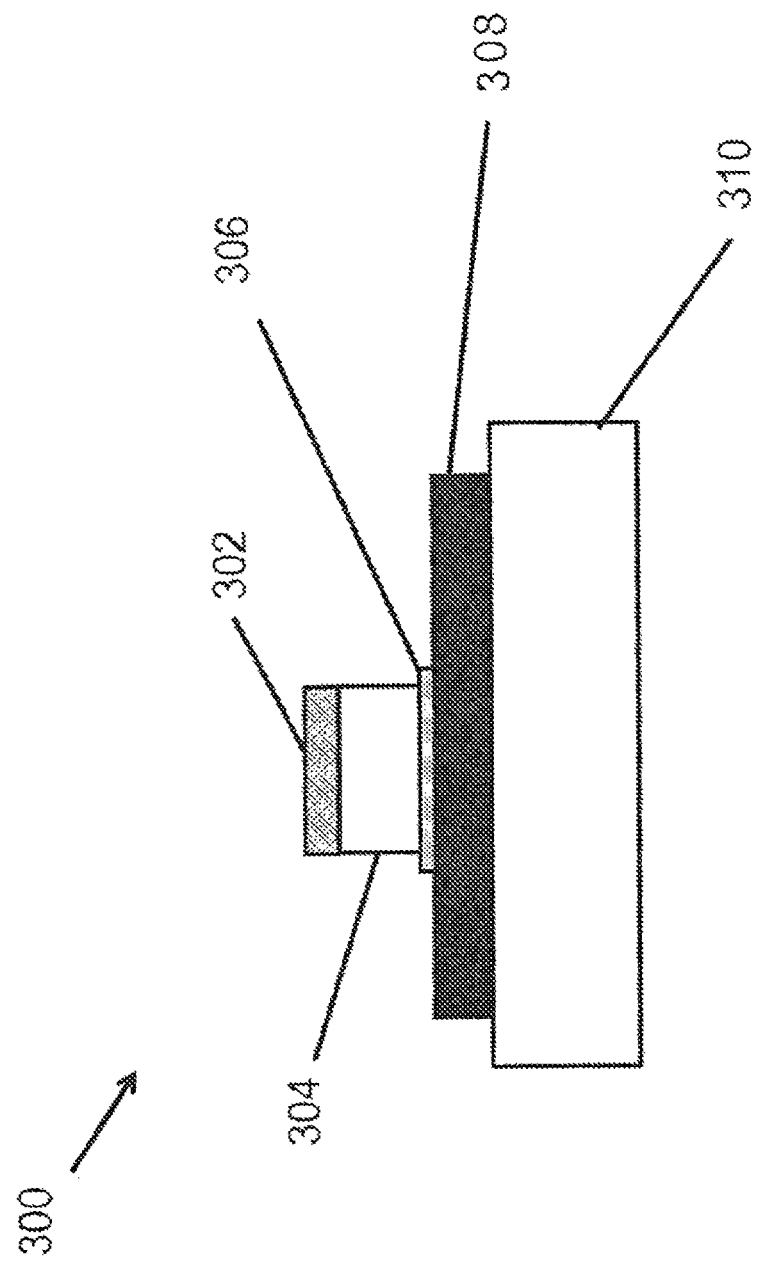
FIG. 2 illustrates a general diagram of a device having a heat generating unit with attached passive cooling device.

In reference to FIG. 2, in some embodiments, the present disclosure provides methods for cooling heat generating units, such as electronic or optoelectronic devices. FIG. 2 illustrates a general diagram of a device 300 with passive cooling means. The device 300 may include a heat generating unit 304, such as, for example, an integrated circuit, chip or single transistor element, or a similar electronic or optoelectronic unit, disposed on a substrate 302. To dissipate heat generated by the heat generating unit 304, the passive cooling portion of the device 300 may include a heat spreader 308 in contact with a surface of the heat generating device 304 on one side and in contact with a heat sink 310 on the opposing side. A thermal interface material (TIM) 306 may be disposed between the heat generating unit 304 and the heat spreader 306 to provide improved thermal contact between the heat generating unit 304 and the heat spreader 308. Use of TIM/heat spreader/heat sink aid in decreasing device operating temperature and improving device efficiency, reliability and mean time to failure. Alternative architectures besides that depicted in FIG. 2, such as placement of TIM and/or heat spreader near the active conducting junction, may also be used to improve device thermal management performance. In various embodiments, the high thermal conductivity compounds of the present disclosure, their alloys, or composites thereof may be used to fabricate substrates, heat spreaders, heat sinks, thermal interface materials, heat generating unit or combinations thereof for passive cooling of heat generating units. Due to their favorable thermal properties, using the high thermal conductivity compounds of the present disclosure, their alloys, or composites thereof, and using BAs and BAs composites in particular, in electronic or optoelectronic devices, for example, will assist in cooling these devices by dissipating heat from the heat generating unit of the device.

In some embodiments, the present disclosure provides heat spreaders composed of the high thermal conductivity compounds of the present disclosure, their alloys, or composites thereof. Non-uniform temperature distributions and hot spots may degrade the heat dissipation efficiency of electronic and optoelectronic devices and elements. A heat spreader improves the heat dissipation efficiency by spreading heat uniformly over a larger area thereby lowering the temperature of the hot regions of the device. Heat spreaders composed of high thermal conductivity materials are highly desirable to passively and rapidly spread heat before it is absorbed by the heat sink. The high thermal conductivity compounds of the present disclosure, their alloys or composites thereof can be used as a high-efficiency heat spreader in part due to their high thermal conductivities. The high thermal conductivity compounds of the present disclosure, their alloys or composites may be manufactured at lower cost than diamond and have a coefficient of thermal expansion (CTE) that is better matched to the heat generating device, which is desirable to minimize thermal stresses on this working device. The heat spreaders may have rectangular, square, circular or any other planar shape. In some embodiments, the heat spreader of the present disclosure may be non-planar to provide a suitable fit with the electronic components surrounding the heat spreader. The heat spreaders may be a solid plate of the high thermal conductivity material of the present disclosure. In some embodiments, the heat spreader of the present disclosure may be made of a composite including one or more of the high thermal conductivity material of the present disclosure. In some embodiments, the heat spreader of the present disclosure may comprise one or more sheets or layers of the high thermal conductivity material of the present disclosure, their alloys or composites thereof.

In some embodiments, the present disclosure describes heat sinks composed of the high thermal conductivity compounds of the present disclosure, their alloys or composites. A heat sink cools a heat generating unit, such as electronic and optoelectronic devices and elements, by absorbing heat generated by the devices and then dissipating this heat into the ambient environment. Heat sinks composed of high thermal conductivity materials with CTEs closely matched to the heat generating device provide excellent cooling performance, especially for electronics, and so are highly desirable. Because the high thermal conductivity compounds of the present disclosure, their alloys or composites thereof possess such desired properties, the high thermal conductivity compounds of the present disclosure, their alloys or composites can be used as high efficiency heat sinks. The high thermal conductivity compounds of the present disclosure, their alloys or composites thereof, and BAs and its alloys or composites in particular, may have much higher thermal conductivity than other commonly used heat sink materials such as copper and aluminum. They may also have lower CTE than these materials giving better CTE matching to most electronic and optoelectronic devices. Heat sinks of the present disclosure may have various designs. Typically, heat sinks include a base and one or more fins extending from the base for heat dissipation. In some embodiments, the high thermal conductivity compounds of the present disclosure, their alloys or composites thereof may be used to form the base, pins or both. In some embodiments, various materials of the present disclosure may be utilized to form different parts of the heat sink.

In some embodiments, the present disclosure describes thermal interface materials including the high thermal conductivity compounds of the present disclosure, their alloys or composites. Such thermal interface materials may be thermal grease, thermal epoxy, thermal paste, thermal gel or similar thermal material. The contact interfaces between electronic and optoelectronic devices and heat spreaders or between heat spreaders and heat sinks normally contain gaps filled with air, which has very low thermal conductivity and therefore inhibits dissipation of heat from the device being cooled. Thermal interface materials are used between the device and heat spreader or heat spreader and heat sink in order to decrease the thermal contact resistance across the interface between two systems. Thermal interface materials with high thermal conductivity and low CTE are highly desirable in Silicon based microelectronics. Because of their high thermal conductivity and low CTE, the high thermal conductivity compounds of the present disclosure, their alloys or composites, and BAs and its alloys and composites in particular, can be used as high efficiency heat transfer thermal interface materials.

In some embodiments, the present disclosure presents low thermal resistance, high power, high temperature electronic and optoelectronic devices using the high thermal conductivity compounds of the present disclosure, their alloys or composites. High power and high temperature devices such as high mobility transistors composed of AlN, GaN and their composites have shown promise for high-frequency and high-power applications. Since large amounts of heat can be generated by these devices, their output-power densities are limited by the thermal conductivities of the substrate materials on which they reside since the heat generated by the device mainly dissipates through the substrate. Due to their high thermal conductivity, it is therefore advantageous to use the high thermal conductivity compounds of the present disclosure, their alloys or composites thereof, and BAs and its alloys and composites in particular, as a substrate material with high thermal conductivity. BAs and BSb are in the same family of III-V semiconductors as AlN, GaN, so may be easier to achieve abrupt interfaces and have better lattice matching between BAs and BSb and their composites and the operating device materials (e.g., AlN and/or GaN). The fabrication of the high thermal conductivity compounds of the present disclosure, their alloys or composites may also be lower cost than diamond. The coefficient of thermal expansion (CTE) of the high thermal conductivity compounds of the present disclosure, their alloys or composites is also better matched to other III-V semiconductors than is that of diamond thereby providing less thermal stress on the device. In some embodiments, the composites of unconventional high thermal conductivity compounds (BAs, BSb, GeC and BeSe) in the form of thin film or thin film coating may be employed. In some embodiments, such film or coating may be attached to single crystal material such as AlN.

In some embodiments, the high thermal conductivity compounds of the present disclosure, their alloys or composites may be deposited on Silicon and/or III-V semiconductor wafers for high efficiency thermal management applications. Performance of Silicon, III-V based and other electronic and optoelectronic devices can benefit from direct deposition on large Silicon wafers of thin films composed of high thermal conductivity, low CTE material. Accordingly, the high thermal conductivity compounds of the present disclosure, their alloys or composites, and BAs or its alloys or composites in particular, which have high thermal conductivity and CTEs better matched to Si and the III-V semiconductors, are suited for this application.

In some embodiments, the high thermal conductivity compounds of the present disclosure, their alloys or composites, and BAs, its alloys or composites in particular, may be used in fabricating electronic and/or optoelectronic devices. These compounds, their alloys or composites may be semiconductors with indirect electronic band gaps of around 1.6 eV (BAs), 0.53 eV (BSb), 1.8 eV (GeC), and 2.4 eV (BeSe). They are in the same family of III-V compounds commonly used in the semiconductor industry. The high thermal conductivity of the high thermal conductivity compounds of the present disclosure, their alloys or composites, and BAs, its alloys and composites in particular, could allow them to function as electronic devices with self-cooling capability. This would minimize the formation of hot spots, which degrade device performance.

In some embodiments, the high thermal conductivity compounds of the present disclosure, their alloys or composites may be used in the fabrication of brake pads. Currently, copper and other metals are being restricted from use in brake pads in some states due to harmful environmental effects of the dust from wear. These metals help provide needed braking friction and heat transfer while being durable and cost-effective. Fibers of the high thermal conductivity compounds of the present disclosure, their alloys or composites may be used to replace metals in brake pads. The high thermal conductivity compounds of the present disclosure, their alloys or composites have a significant microhardness (e.g., 19 GPa for BAs) higher than metals currently used in the brake pads, but lower than diamond and other "hard" crystals. Thus, the high thermal conductivity compounds of the present disclosure, their alloys or composites are resistant to wear and may provide less wear on brake rotors than other materials. Further, the high thermal conductivity compounds of the present disclosure, their alloys or composites, and BAs, its alloys and composites in particular, have a higher thermal conductivity than the commonly used brake materials, so they can enhance heat spreading and reduce the wear.

The methods and materials of the present disclosure are described in the following Examples, which are set forth to aid in the understanding of the disclosure, and should not be construed to limit in any way the scope of the disclosure as defined in the claims which follow thereafter. The following examples are put forth so as to provide those of ordinary skill in the art with a complete disclosure of the embodiments of the present disclosure, and are not intended to limit the scope of what the inventors regard as their invention nor are they intended to represent that the examples below are all or the only calculations performed. Efforts have been made to ensure accuracy with respect to numbers used (e.g. amounts, temperature, etc.) but some calculational deviations should be accounted for.

EXAMPLES

Example 1

First Principles Calculations of Lattice Thermal Conductivity of Unconventional High Thermal Conductivity Compounds: Boron Arsenide, Boron Antimonide, Germanium Carbide and Beryllium Selenide In semiconductors and insulators heat is carried primarily by the atomic vibrations of the lattice given by phonons [Ziman, J. M. *Electrons and Phonons* (Oxford University Press, London, 1960).]. The lattice thermal conductivity is a scalar for the cubic crystals considered here, and is given by:

$$\kappa = \frac{1}{V} \sum_\lambda C_\lambda v_{\lambda\alpha}^2 \tau_{\lambda\alpha} \qquad (1)$$

where V is the crystal volume, $C_\lambda = k_B n_\lambda^0 (n_\lambda^0 + 1)(\hbar\omega_\lambda/k_B T)^2$ is the specific heat per phonon mode, $k_B$ is the Boltzmann constant and $n_\lambda^0 = 1/(\exp(\hbar\omega_\lambda/k_B T) - 1)$ is the Bose factor. The sum is over all phonon modes, $\lambda = (q, j)$, with wavevector q and polarization j, and $\omega_\lambda$ is the phonon frequency. $\kappa_{\alpha\alpha} = \kappa$, and $v_{\lambda\alpha}$ and $\tau_{\lambda\alpha}$ are the velocity and transport lifetime along a cubic direction $\alpha$ for the small T gradients under consideration.

In the first principles approach used here, the phonon frequencies and velocities are determined by diagonalizing the dynamical matrix, and the phonon transport lifetimes are calculated using an exact numerical solution of the linearized Boltzmann transport equation for phonons [Omini, M. & Sparavigna, A. Beyond the isotropic-model approximation in the theory of thermal conductivity, *Phys. Rev. B* 53, 9064-9073 (1996), Omini, M. & Sparavigna, A. Thermal conductivity of dielectric solids with diamond structure, *Nuovo Cimento Soc. Ital. Fis., D* 19, 1537-1564 (1997)]. The only inputs are the harmonic and anharmonic interatomic force constants, which are obtained using density functional theory [Hohenberg, P. & Kohn, W. Inhomogeneous electron gas, *Phys. Rev.* 136, B864-B871 (1964), Kohn, W. & Sham, L. J. Self-consistent equations including exchange and correlation effects, *Phys. Rev.* 140, A1133 (1965)] and density functional perturbation theory [Baroni, S., Gironcoli, S., Corso, A. D. & Giannozzi, P. Phonons and related crystal properties from density-functional perturbation theory, *Rev. of Mod. Phys.* 73, 515 (2001)]. The details have been published elsewhere [Lindsay, L., Broido, D. A., and Reinecke, T. L. Thermal conductivity and large isotope effect in GaN from first principles, *Phys. Rev. Lett.* 109, 095901 (2012), Lindsay, L., Broido, D. A., & Reinecke, T. L. submitted (2012)]. Previous work demonstrated good agreement with measured values of $\kappa$ for Si, Ge, diamond [Broido, D. A., Malorny, M., Birner, G., Mingo, N., & Stewart, D. A. Intrinsic lattice thermal conductivity of semiconductors from first principle, *Appl. Phys. Lett.* 91, 231922 (2007), Ward, A., Broido, D. A. Stewart, D. A. & Deinzer, G. Ab initio theory of the lattice thermal conductivity in diamond, *Phys. Rev. B* 80, 125203 (2009)], GaN [Lindsay, L., Broido, D. A., and Reinecke, T. L. Thermal conductivity and large isotope effect in GaN from first principles, *Phys. Rev. Lett.* 109, 095901 (2012)], BeO [Lindsay, L., Broido, D. A., and Reinecke, T. L. Phonon-isotope scattering and thermal conductivity in materials with a large isotope effect: A first principles study, *Phys. Rev. B* 88, 144306 (2013)] and a number of other III-V compounds [Lindsay, L., Broido, D. A., and Reinecke, T. L. Ab initio thermal transport in compound semiconductors, *Phys. Rev. B* 87, 165201 (2013)] using no adjustable parameters.

The intrinsic lattice thermal conductivity, $\kappa_{pure}$, is governed by three-phonon scattering arising from the anharmonicity of the interatomic potential [Ziman, J. M. *Electrons and Phonons* (Oxford University Press, London, 1960).], and it is the upper bound to $\kappa$ for a non-metallic material. All scatterings should satisfy momentum and energy conservation, $q \pm q' = q'' + K$ and $\omega_\lambda \pm \omega_{\lambda'} = \omega_{\lambda''}$, where K is a reciprocal lattice vector. In general the important acoustic (a) and optic (o) phonon scattering channels are the three-phonon scatterings aaa and aao [ooo processes are forbidden in most materials because three optic phonons usually cannot satisfy energy conservation. aoo scattering, while present, is severely restricted in most materials by the combined conservation conditions.]. This anharmonic scattering often dominates the thermal resistance of good quality bulk materials around RT. Scattering of phonons by isotopes can also play an important role in reducing $\kappa$ in some materials. Isotope scattering is included using a standard perturbation theory approach [Tamura, S. I. Isotope scattering of large-wave-vector phonons in GaAs and InSb: Deformation-dipole and overlap-shell models, *Phys. Rev. B* 30, 849-854 (1984)] to determine $\kappa$ for naturally occurring materials, $\kappa_{nat}$. In real materials, sample-specific thermal resistance from extrinsic defects, grain boundaries and other impurities can lower $\kappa$ from the values given here.

Figure 3:
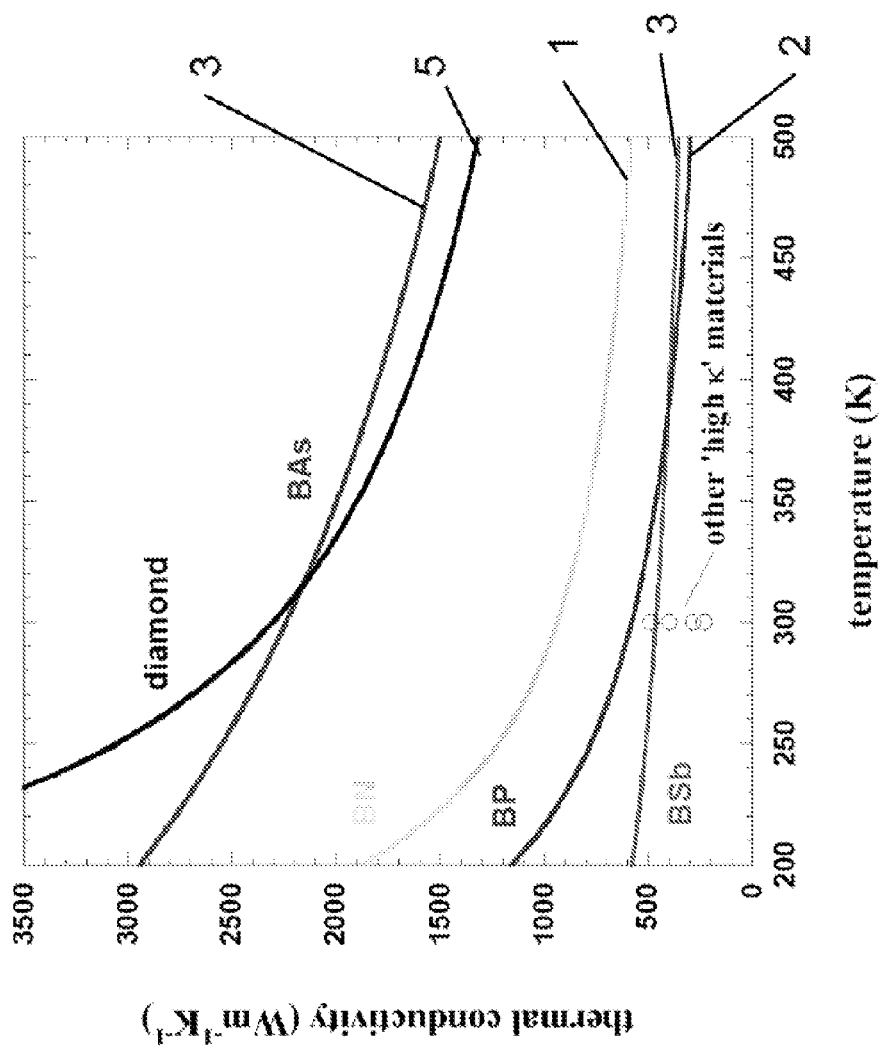
FIG. 3 presents calculated thermal conductivity of materials with naturally occurring isotope mixtures ($\kappa_{nat}$) versus temperature for cubic Boron Nitride (BN), Boron Phosphide (BP), BAs, BSb (herein referred to as the BX compounds), and diamond.
Figure 4:
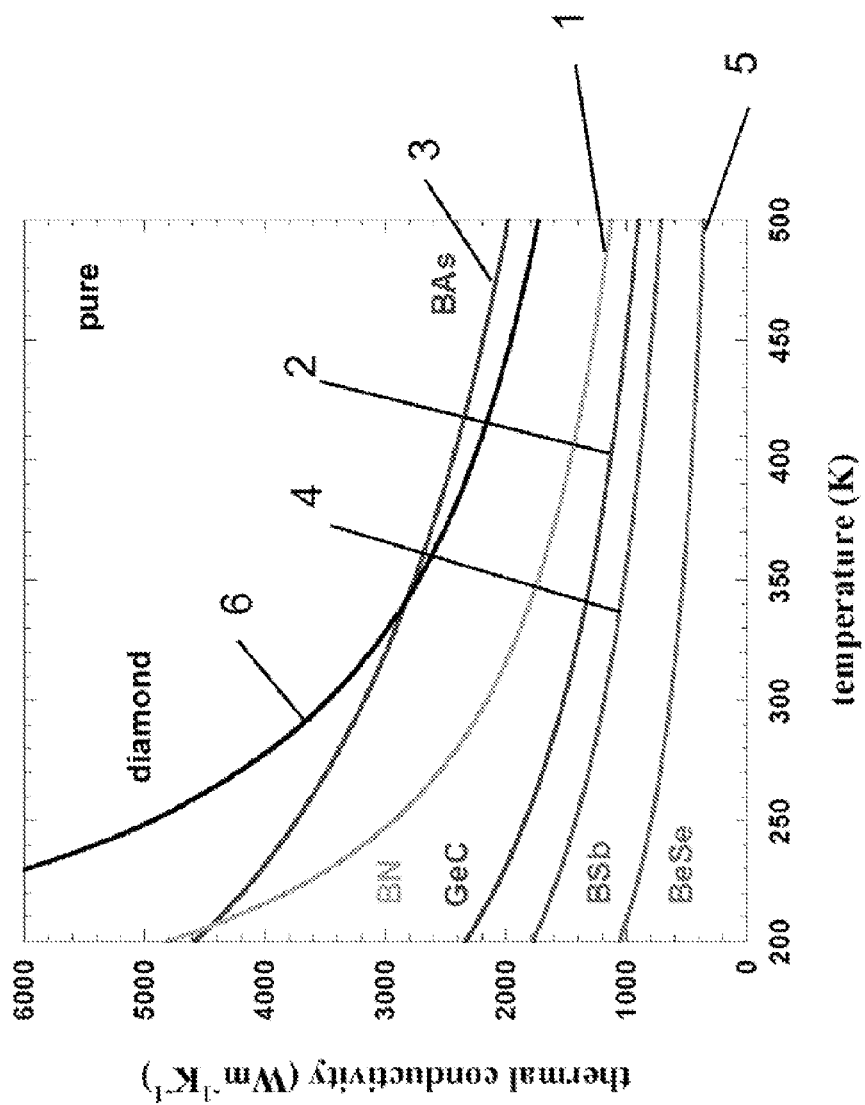
FIG. 4 presents calculated thermal conductivity isotopically pure materials ($\kappa_{pure}$) versus temperature for cubic Boron Nitride (BN), cubic Germanium Carbide (GeC), BAs, BSb, Beryllium Selenide (BeSe), and diamond.

The main results are given in FIG. 3, FIG. 4 and Table 1 in FIG. 5 where calculated $\kappa_{nat}$ for Boron based systems are shown. FIG. 3 presents calculated $\kappa_{nat}$ versus temperature for cubic BN (gold), BP (purple), BAs (red), BSb (green), and diamond (black). $\kappa_{nat}$ includes anharmonic phonon scattering and scattering by naturally occurring concentrations of isotopes. Measured RT $\kappa$'s for common high thermal conductivity materials are given by circles for Gallium Nitride (230 Wm$^{-1}$K$^{-1}$), Aluminum (240 Wm$^{-1}$K$^{-1}$), Aluminum Nitride (285 Wm$^{-1}$K$^{-1}$), Copper (400 Wm$^{-1}$K$^{-1}$), and Silicon Carbide (490 Wm$^{-1}$K$^{-1}$). All of the Boron based compounds have unusually high $\kappa_{nat}$ at RT (300K) with values for BN, BP and BAs being greater than measured values for other high $\kappa$ materials. The RT $\kappa_{nat}$ value for BAs is remarkably high, far higher than all other materials except diamond. FIG. 4 presents calculated $\kappa_{pure}$ versus temperature for cubic BN (1), GeC (2), BAs (3), BSb (4), BeSe (5), and diamond (6). $\kappa_{pure}$ denotes isotopically pure materials and so includes only anharmonic phonon scattering. Again, BAs has an exceptionally high $\kappa_{pure}$ comparable to diamond. Isotopically purified GeC and BeSe have much larger $\kappa_{pure}$ than $\kappa_{nat}$ with RT $\kappa_{pure}$ values of 1517 Wm$^{-1}$K$^{-1}$ and 633 Wm$^{-1}$K$^{-1}$, respectively. Table 1 in FIG. 5 presents $M_{avg}$ and calculated $\theta_D$, RT $\kappa_{nat}$ and $\kappa_{pure}$, and percent enhancement to $\kappa$ with isotopic purification given by $P = 100 \times (\kappa_{pure}/\kappa_{nat} - 1)$ for materials considered herein. The naturally occurring isotope concentrations used to determine $\kappa_{nat}$ for these materials were: (19.9% $^{10}$B, 80.1% $^{11}$B), (98.9% $^{12}$C, 1.1% $^{13}$C), (57.2% $^{121}$Sb, 42.8% $^{123}$Sb), (92.2% $^{28}$Si, 4.7% $^{29}$Si, 3.1% $^{30}$Si), and (20.4% $^{70}$Ge, 27.3% $^{72}$Ge, 7.8% $^{73}$Ge, 36.7% $^{74}$Ge, 7.8% $^{76}$Ge), and (0.8% $^{74}$Se, 9.4% $^{76}$Se, 7.6% $^{77}$Se, 23.8% $^{78}$Se, 49.6% $^{80}$Se, and 8.7% $^{82}$Se). All other elements are isotopically pure. The difference between $\kappa_{nat}$ and $\kappa_{pure}$ reflects the relative strengths of the intrinsic phonon-phonon scattering and the phonon-isotope scattering.

$\kappa_{nat}$ for two of the unconventional high thermal conductivity compounds (BAs, BSb) are higher than those of other non-carbon based high $\kappa$ materials. In particular, $\kappa_{nat}$, for BAs is found to be considerably higher than those for the other systems attaining a RT value of 2240Wm$^{-1}$K$^{-1}$ over ten times higher than predicted by conventional reasoning [Slack, G. A. Nonmetallic crystals with high thermal conductivity, *J. Phys. Chem. Solids* 34, 321-335 (1973).]. In addition, it is larger than that for diamond above RT. This is surprising given the criteria above because $M_{avg}$ of BAs is over three times larger than that of diamond and the calculated $\theta_D$ of BAs is about three times smaller (see FIG. 5, Table 1). Furthermore, the value calculated for the RT coefficient of thermal expansion (CTE), a typical measure of anharmonicity, is about three times larger in BAs than in diamond.

The calculated exceptionally high thermal conductivity, $\kappa_{nat}$, of BAs with naturally occurring isotope mixtures can be seen in FIG. 3. Here it is also seen that (i) the thermal conductivities for BAs and BSb drop less rapidly with temperature than they do for diamond, BN and BP; (ii) As the anion changes from N to P to As and to Sb, $M_{avg}$ increases and $\theta_D$ decreases monotonically, but the RT $\kappa_{nat}$ fluctuates (see Table 1). This behavior is illustrated in FIG. 6 where $\kappa_{pure}$ is given as a function of $M_{avg}$ for the BX series and also for elemental materials.

Figure 6:
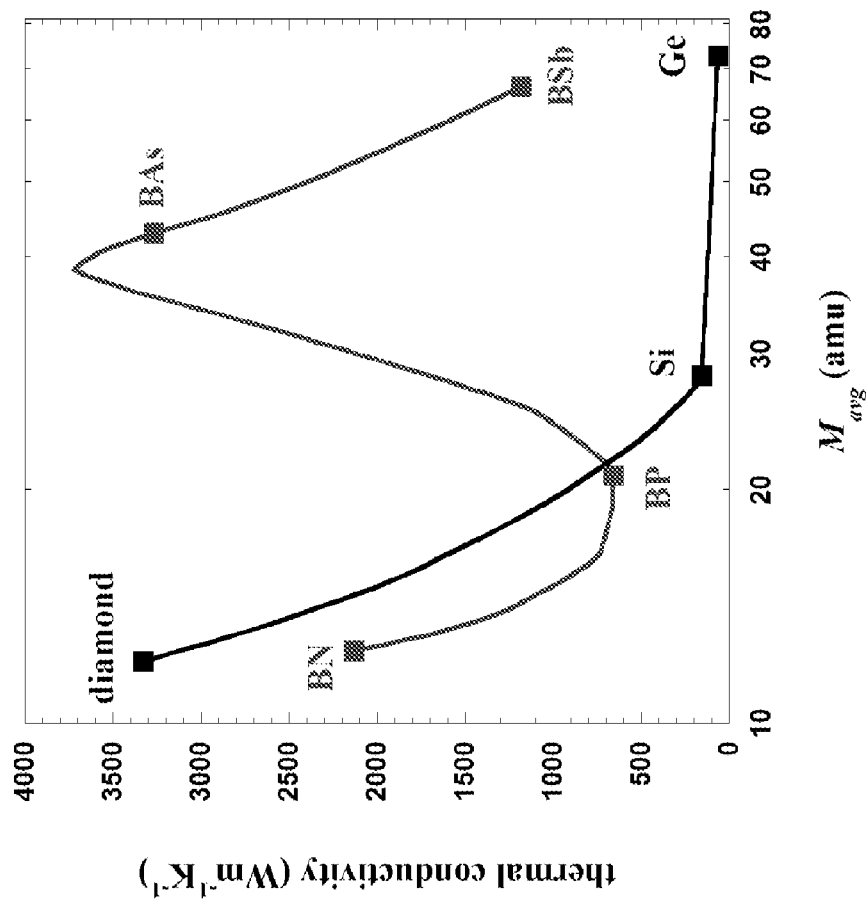
FIG. 6 presents calculated RT $\kappa_{pure}$ (solid curve) versus $M_{avg}$ for BX crystals where the properties (atomic masses, interatomic force constants, effective charges, dielectric constants) of the anion, X, are averaged continuously using the relative anion concentrations in going from Nitrogen (N) to Phosphorous (P) to Arsenic (As) to Antimony (Sb).

FIG. 6 presents calculated RT $\kappa_{pure}$ (solid curve) vs. $M_{avg}$ for BX crystals where the properties (atomic masses, interatomic force constants, effective charges, dielectric constants) of the anion, X, are averaged continuously using the relative anion concentrations in going from N to P to As to Sb. $\kappa_{pure}$ calculated for elemental group IV materials spanning diamond (C) to Silicon (Si) to Germanium (Ge) by averaging their properties is also shown. Qualitatively similar curves can be obtained plotting $\kappa_{pure}$ against the Debye temperature, $\theta_D$. The calculated intrinsic thermal conductivities ($\kappa_{pure}$) for the BX compounds are shown by the solid red squares, and those for the elemental materials (C, Si and Ge) are shown by the black squares.

The curve for the elemental materials follows the typical behavior with $\kappa_{pure}$ decreasing monotonically with increasing $M_{avg}$. This is associated with the heavier mass and reduced $\theta_D$ that result in decreased acoustic phonon velocities and frequencies and increased phonon-phonon scattering by increasing phonon populations. The BX curve initially follows a similar trend with $\kappa_{pure}$ dropping from BN to BP. However, the BX curve then rises from BP to peak at 3725 Wm$^{-1}$K$^{-1}$ with BAs appearing very near this peak before dropping again to BSb.

The unusual behavior seen in FIG. 6 stems largely from the interplay of two vibrational properties of these systems: i) a large mass ratio of constituent atoms. This provides a large frequency gap between acoustic and optic phonons (a-o gap). A sufficiently large a-o gap removes much of the intrinsic thermal resistance due to anharmonic scattering between acoustic and optic phonons. In BAs compounds, the large mass ratio of As to B in BAs, which is about 7, results in a large a-o gap. ii) A bunching together of the acoustic phonon dispersions. This removes intrinsic thermal resistance due to anharmonic scattering between acoustic phonons. The bunching can occur in compound materials where one or more constituent atoms are Beryllium, Boron, Carbon or Nitrogen due to the unusual nature of the atomic bonds; it is seen in BAs as well as in some Beryllium, Boron, Carbon and Nitrogen compounds. Both properties are illustrated in FIG. 3 which compares BAs and Si dispersions. In addition, the light Boron mass keeps $M_{avg}$ relatively small, and this, combined with the stiff almost purely covalent bonding, gives unusually high overall frequency scales and large acoustic velocities in the BX compounds compared to other III-V materials such as GaAs.

A third important property to achieve high thermal conductivity is having the isotopically pure heavy atom in a compound with large atomic mass ratio between constituent heavy atom and light atoms. For large atomic mass ratio compounds the motion of the heavy atoms dominates for the heat-carrying acoustic phonon modes. Thus, compounds having isotopically pure heavy atoms show significantly weaker phonon-isotope scattering than those with heavy atoms having large isotope mixtures. In BAs, the heavy atom (As) is isotopically pure.

The three newly-identified properties are not included in the conventional criteria for determining thermal conductivity. The a-o gap helps determine the anharmonic scattering of acoustic phonons from optic phonons through aao scattering, and the bunching of acoustic branches helps determine the three-phonon acoustic mode aaa scattering, and the isotope mix on the heavy atom helps determine the scattering of phonons by isotopes, as shown in Table 2 in FIG. 7. The advantageous combination of these three properties in BAs results in much weaker thermal resistance over a wide temperature range and, in particular around room temperature, than would be expected based on just the conventional criteria.

Table 2 presents the mass ratio of the several compounds (the mass ratio of the elemental materials is 1), calculated a-o frequency gap scaled by the maximum acoustic phonon frequency (no aao scattering can occur for values larger than 1); presence or absence of aao scattering and bunching; relative strength of aaa scattering in the higher frequency range of the acoustic phonon spectrum of each material; presence or absence of isotopically pure heavy atom.

Example 2

Coefficient of Thermal Expansion of the High Thermal Conductivity Compounds: Bas, Bsb, Gec and Bese For passive cooling of electronics, a low CTE is desirable to avoid introducing thermal stresses to the sensitive electronics. Desirable RT CTE's are typically in the range of $2 \times 10^{-6}$K$^{-1}$ to $7 \times 10^{-6}$K$^{-1}$. The specific unconventional high thermal conductivity compounds, BAs, BSb, GeC and BeSe, have calculated CTEs in this range, with RT values of around $3 \times 10^{-6}$K$^{-1}$ for BAs and GeC at the lower end, BSb (RT CTE=$3.5 \times 10^{-6}$K$^{-1}$) in the middle of this range and BeSe (RT CTE=$6.6 \times 10^{-6}$K$^{-1}$) at the high end. In particular, the RT CTE of BAs of around $3 \times 10^{-6}$K$^{-1}$ is quite close to that of Silicon, the most widely used material in the semiconductor industry. Thus the desirable κ and the CTE values in these unconventional high thermal conductivity compounds, and in BAs in particular, may provide new opportunities in thermal management for electronics.

In some embodiments, an unconventional high thermal conductivity compound (including but not restricted to BAs, BSb, GeC or BeSe) or alloys or composites thereof are described. In some embodiments, the compound is Boron Arsenide. In some embodiments, the compound is crystallized in the zinc blende cubic structure.

In some embodiments, a heat dissipating or heat-conducting element for use in thermal management applications includes an unconventional high thermal conductivity compound (including but not restricted to BAs, BSb, GeC or BeSe) or alloys or composites thereof. In some embodiments, the Boron based compound is Boron Arsenide.

In some embodiments, a device having a heat generating unit, such as an electronic device, disposed on a substrate, includes a heat spreader in thermal communication with the heat generating unit on one side and a heat sink on the other, and optionally, a thermal interface material to provide thermal contact for transfer of heat generated by the heat generating unit, wherein at least one of the heat generating unit, substrate, heat spreader, heat sink, or thermal interface material comprises an unconventional high thermal conductivity compound (including but not restricted to BAs, BSb, GeC or BeSe) or alloys or composites thereof. In some embodiments, the compound is Boron Arsenide.

Example 3

Phonon Thermal Transport in Boron Arsenides Compared to Other Related Materials

The background information for Example 3 is described in "Ab initio study of the unusual thermal transport properties of boron arsenide and related materials," PHYSICAL REVIEW B 88, 214303 (2013), which is incorporated herein by reference in its entirety.

Figure 8:
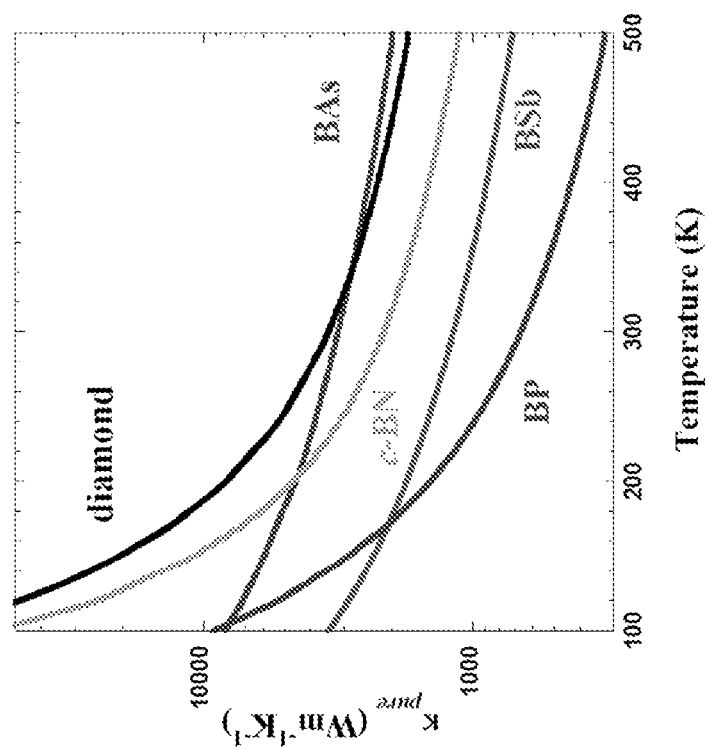
FIG. 8 presents a graph of intrinsic thermal conductivity, $\kappa_{pure}$, as a function of temperature for c-BN (orange), BP (purple), BAs (red), and BSb (green). Also shown is the $\kappa_{pure}$ of diamond (black).

Intrinsic Thermal Conductivity: FIG. 8 shows the calculated intrinsic κ ($κ_{pure}$) for isotopically pure c-BN, BP, BAs, BSb and diamond as a function of temperature. Around and above room temperature the intrinsic κ for BAs is considerably higher than those for the other BX systems reaching a RT value of around 3200Wm$^{-1}$K$^{-1}$, which is comparable to that of diamond, and even larger than that of diamond above RT. This result is not predicted using the conventional guidelines that direct the search for high κ materials. For example, in comparing with diamond, the $M_{avg}$ of BAs is over three times larger, the calculated $θ_D$ of BAs is about three times smaller, and the anharmonicity in the two materials is roughly the same by conventional measure.

Figure 9:
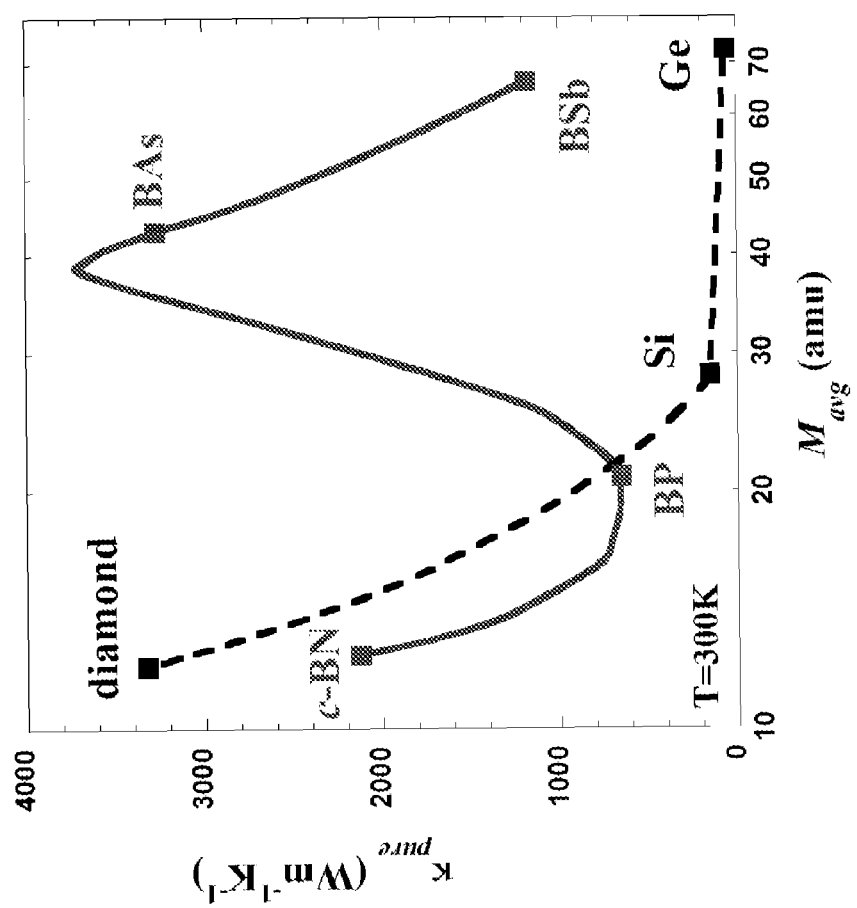
FIG. 9 presents a graph of calculated RT $\kappa_{pure}$ (solid curve) as a function of $M_{avg}$ for BX crystals where the properties (atomic masses, interatomic force constants, effective charges, dielectric constants) of pairs of group V atoms (i.e. X in BX) are averaged continuously using their relative concentrations in going from N to P to As to Sb. Also shown is the $\kappa_{pure}$ calculated by averaging the properties of elemental group IV materials spanning diamond to silicon (Si) to germanium (Ge) (dashed curve). Qualitatively similar curves can be obtained plotting $\kappa_{pure}$ against the Debye temperature, $\theta_D$. The calculated $\kappa_{pure}$ values for the BX materials are shown by the solid red squares, and those for the elemental materials (diamond, Si and Ge) are shown by the black squares.

The unusual behavior of κ in BAs and the other BX materials is illustrated in FIG. 9 where the RT $κ_{pure}$ is given as a function of $M_{avg}$ for the BX materials and for the elemental materials: diamond, Si and Ge. The solid curve segments are obtained by averaging relevant physical properties (atomic masses, force constants, lattice constants, etc.) of each pair of materials at the segment endpoints. The curve for the elemental materials follows the typical behavior with κ$_{pure}$ decreasing monotonically with increasing M$_{avg}$. This is associated with the heavier mass and reduced θ$_D$ that result in decreased acoustic phonon velocities and frequencies and with increased phonon-phonon scattering by increasing phonon populations. The BX curve initially follows a similar trend with κ$_{pure}$ dropping from c-BN to BP. However, the curve then rises from BP to peak at around 3700 Wm$^{-1}$K$^{-1}$ with BAs appearing very near this peak before dropping again to BSb. The same unusual behavior was found for κ$_{pure}$ in the beryllium-VI cubic compounds, although with lower thermal conductivities.

Underlying this surprising behavior are features of BAs in particular and the BX materials in general that conspire to cause weak intrinsic thermal resistance. First, the light boron mass keeps the average atomic mass relatively small, and this combined with the stiff bonding gives unusually high frequency scales in the BX materials compared to many other materials. Second, the large mass difference between As and B ($M_{As}/M_B$=6.93) produces a large gap between acoustic and optic phonon branches (the a-o gap) (see FIG. 11 for the phonon dispersion of BAs, and FIG. 18). Finally, in the BX materials and diamond, the acoustic branches are closer together than they are in Si. This is particularly noticeable along the Γ→K direction where the TA$_2$ and LA branches come quite close.

Figure 10:
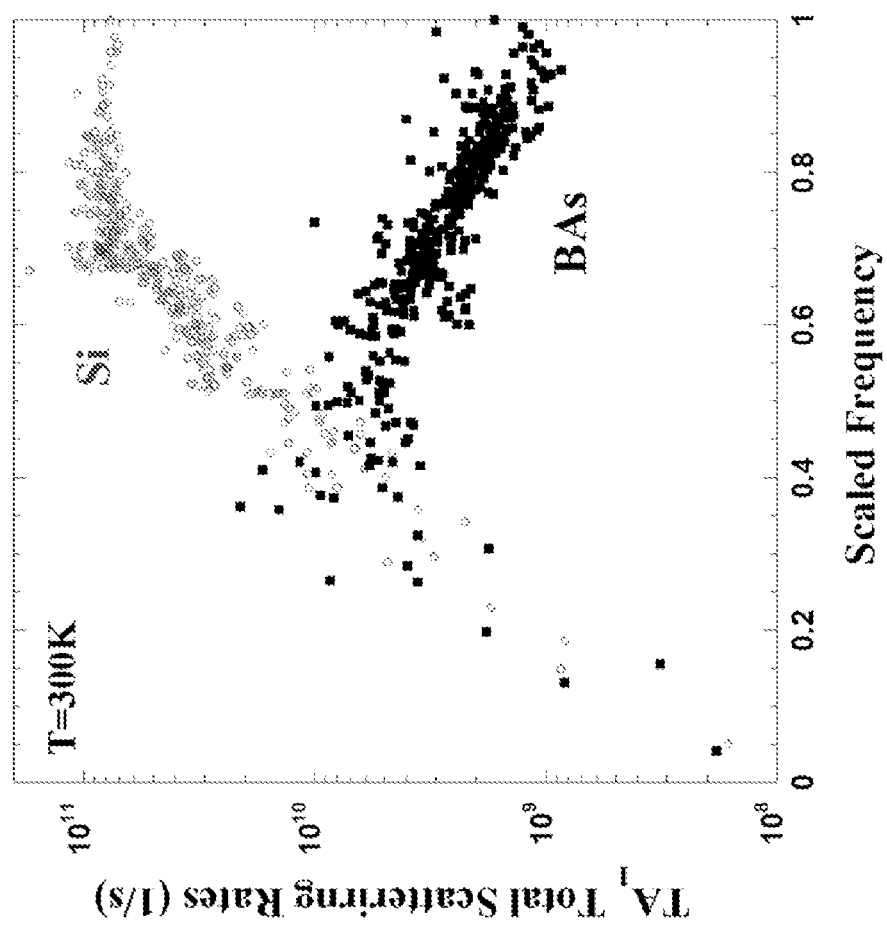
FIG. 10 is total anharmonic three-phonon scattering rates for the $TA_1$ branch at T=300K for BAs (solid black squares) and Si (hollow red circles) as a function of frequency. The phonon frequencies are scaled by the highest $TA_1$ frequency for each material. The total scattering rates increase monotonically with increasing frequency in Si, while in BAs they decrease with increasing frequency in the mid to high frequency range.
Figure 11:
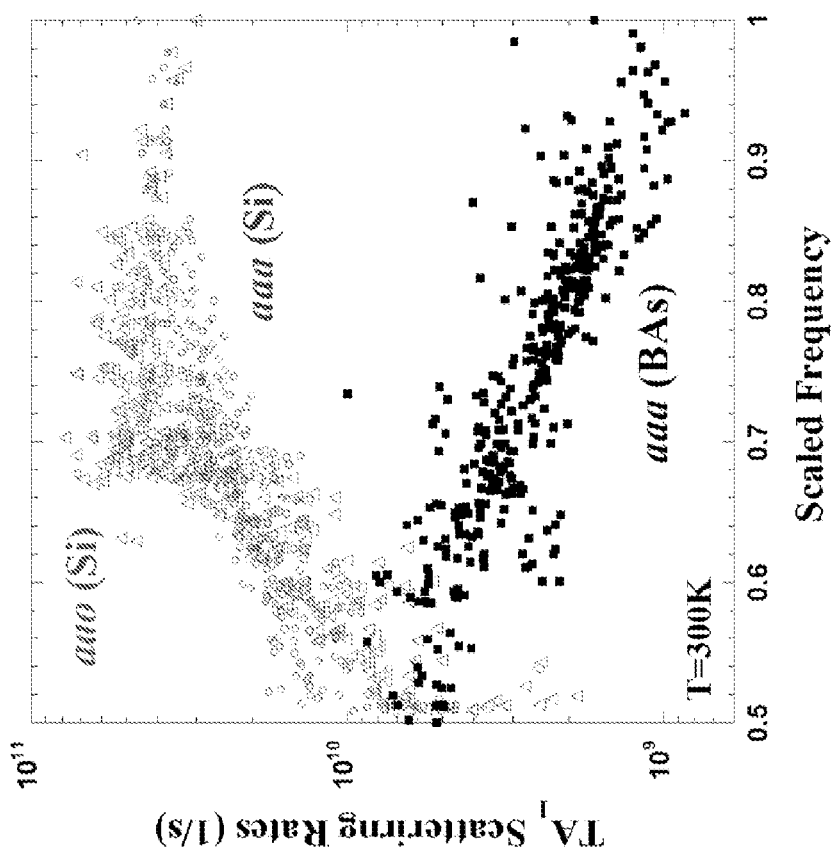
FIG. 11 is anharmonic three-phonon scattering rate contributions for the $TA_1$ branch at T=300K from the aao and aaa processes as a function of frequency. Solid black squares give the aaa contributions for BAs. Hollow red circles (green triangles) give the aaa (aao) contributions for Si. The phonon frequencies are scaled by the highest $TA_1$ frequency for each material.

Intrinsic phonon-phonon scattering rates: The larger a-o gap and the bunching of the acoustic branches have a profound effect on the intrinsic anharmonic scattering rates of BAs. To illustrate this, FIG. 10 and FIG. 11 compare these scattering rates against frequency for phonons from the TA$_1$ branch in Si and BAs. The frequencies are obtained on a fine mesh of q points in the irreducible wedge of the Brillouin zone. The spread in values at each frequency reflects the q-dependent anisotropy in the scattering rates. This comparison is useful since BAs and Si have similar frequency ranges and acoustic velocities for their acoustic branches. FIG. 10 shows the total scattering rates, while FIG. 11 gives the scattering rate breakdown by the different combinations of a or o phonons. For ease of comparison, frequency is scaled by the maximum calculated acoustic phonon frequency for each material. At low frequencies (not shown in FIG. 11), aaa and aoo contributions to the intrinsic scattering rates are similar and dominant in both materials. In Si, at higher frequencies aaa and aao processes dominate and are comparable in strength. The total scattering rates shown in FIG. 10 (i.e., aaa+aao+aoo) increase monotonically with increasing frequency in Si. In contrast, the scattering rate behavior in BAs is quite different. There the aao processes are absent due to the large a-o gap. Further, with increasing frequency the aaa processes in BAs first increase, then decrease in the mid to high frequency range of the acoustic phonon spectrum becoming more than an order of magnitude smaller in BAs than those for Si approaching the highest frequency region.

Figure 12:
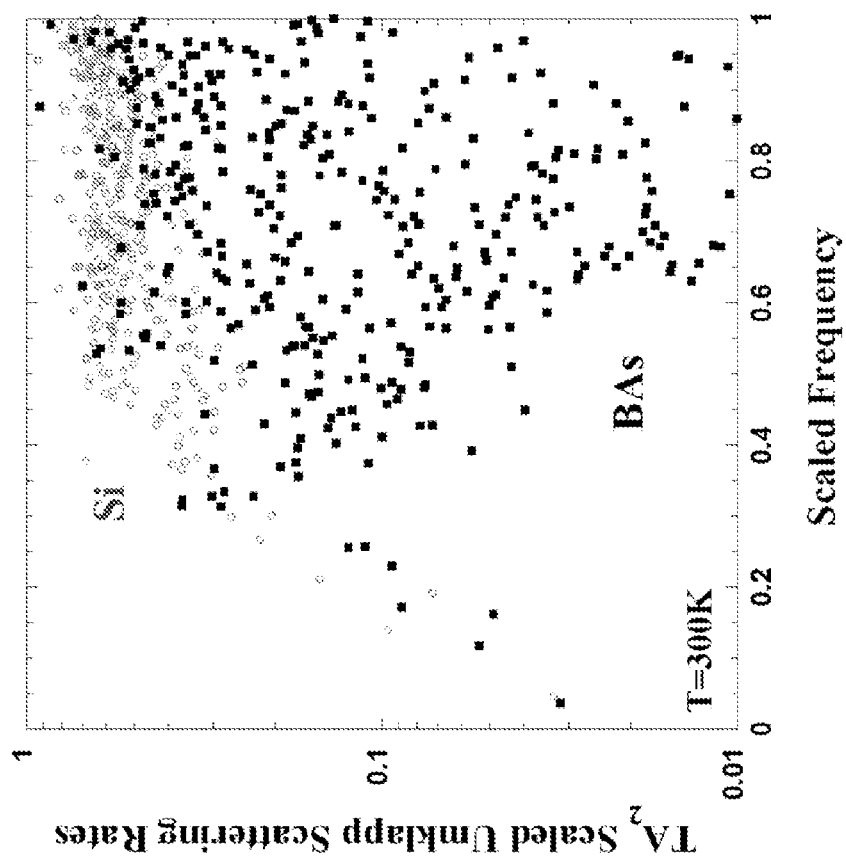
FIG. 12 is Umklapp scattering rates for the $TA_2$ branch at RT as a function of frequency for BAs (solid black squares) and Si (hollow red circles). The umklapp scattering rates are scaled by the total anharmonic three-phonon scattering rates, and the phonon frequencies are scaled by the highest $TA_2$ frequency for each material. The weaker umklapp scattering ratio for BAs at higher frequencies is particularly striking since the total BAs intrinsic scattering rates are already much smaller than those in Si.

Another difference is seen by examining the respective strengths of the Umklapp (U) scattering rates in Si and BAs. Acoustic phonons carry the majority of the heat due to their larger acoustic velocities and larger phonon populations compared to optic phonons. Umklapp scattering, which is directly responsible for the thermal resistance, typically occurs for higher frequency acoustic phonons whose wave vectors are a substantial fraction of the Brillouin zone. FIG. 12 gives the ratio of the anharmonic scattering rates for U processes to the total intrinsic scattering rates (U+N) as a function of frequency for phonons in the TA$_2$ branch. Phonon frequencies are again scaled by the largest frequency in that branch. In the region of small frequencies N scattering is prevalent and U scattering is weak for both materials, as expected. For higher frequencies, the resistive U scattering becomes dominant in Si. In contrast, the U scattering is relatively weak in BAs even at higher frequencies. This is particularly striking given that the total intrinsic scattering rates for BAs in this frequency range are already weak as seen in FIG. 10 and FIG. 11.

Figure 13:
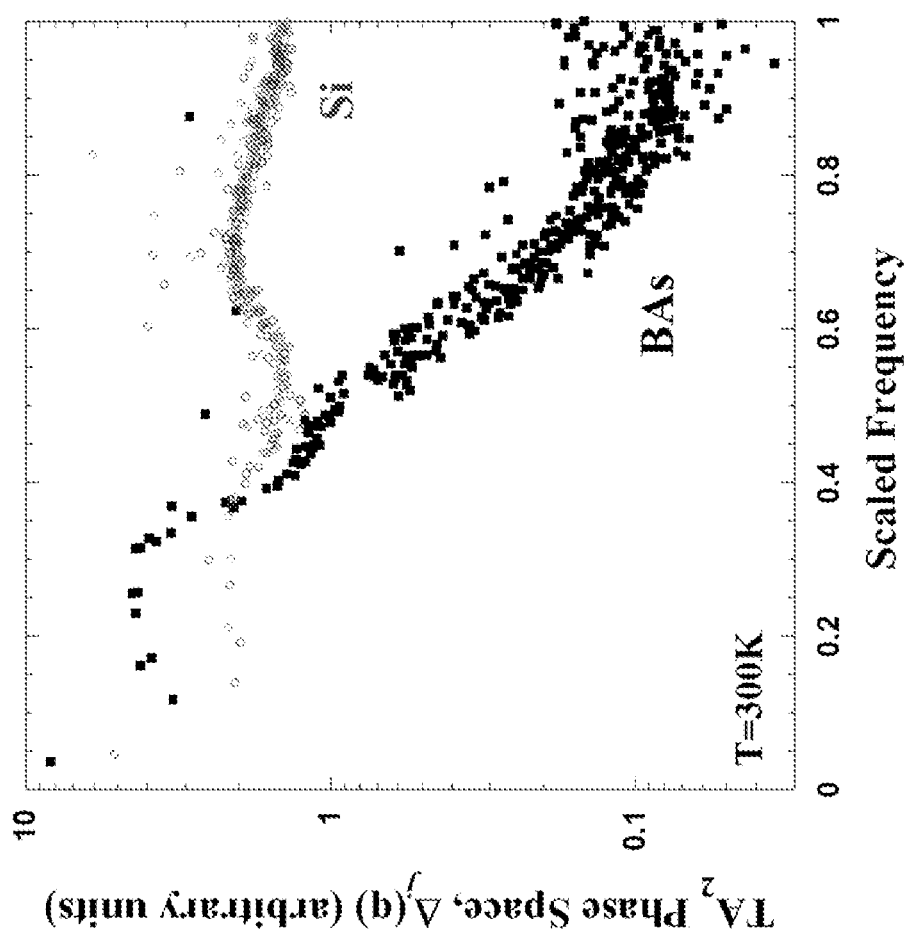
FIG. 13 is phase space for three-phonon scattering per phonon mode for the $TA_2$ branch at RT as a function of scaled frequency for BAs (solid black squares) and Si (hollow red circles), as defined from the two-phonon density of states. The rapid phase space decrease in BAs arises from a decrease in aaa processes resulting from the bunching together of the acoustic branches.

Insight into the weak intrinsic scattering rates of the acoustic phonons in BAs is gained from examination of the two-phonon density of states:

$$D_j^\pm(q) = \sum_{j',j''} \int dq' \delta(\omega_j(q) \mp \omega_{j'}(q') - \omega_{j''}(q \pm q' - K)) \quad (1)$$

which gives a measure of the phase space available for three-phonon scattering per phonon mode, $\Delta_j(q)=D_j^+(q)+D_j^-(q)/2$. FIG. 13 compares $\Delta_{TA_2}(q)$ for Si and BAs for the fine q mesh in the irreducible wedge. As in FIGS. 10-12, the spread in values reflects the q-anisotropy of this phase space. The horizontal axis again gives phonon frequency scaled by the largest TA$_2$ frequency for a mesh of q points taken from the irreducible wedge of the Brillouin zone. For small frequency corresponding to small q near the center of the Brillouin zone, the TA$_2$ phase space for three-phonon scattering in BAs is comparable to or larger than that of Si. However, for higher frequencies this phase space decreases rapidly in BAs while staying roughly constant in Si. The large a-o gap in BAs has removed all aao processes, which are prevalent in Si (see FIG. 11). Thus, the rapid phase space decrease in BAs arises from a decrease in aaa processes, which is a direct consequence of the bunching of acoustic branches. aaa processes become forbidden throughout most, if not all, of the Brillouin zone if the acoustic branches coincide. As the acoustic branches approach this limit, the phase space for three-phonon scattering decreases correspondingly. While this limit does not actually occur in any material, the bunching of the acoustic branches is quite noticeable in the mid to high frequency range in BAs, the other BX materials and in diamond, (see FIG. 18). The dominant three-phonon aaa scattering processes was found in the elemental group IV and zinc blende III-V materials that was studied involve two TA phonons and one LA phonon: TA$_{1,2}$+TA$_{1,2}$←→LA. The bunching together of the three acoustic branches in BAs compared to Si throughout the Brillouin zone reduces the phase space for this scattering, as seen in FIG. 13.

An additional consequence of the acoustic branch bunching is the weakening of the three-phonon scattering matrix elements, $|\Phi_{\lambda\lambda'\lambda''}|^2$ for the allowed aaa processes. Since the acoustic branches are similar in energy due to the bunching, a phonon with frequency $\omega_\lambda$ in the higher-frequency range can decay via a three-phonon process into two phonons, one with a similar high frequency, $\omega_{\lambda''}$, and one with a small frequency, $\omega_{\lambda'}$, and thus small wave vector magnitude, q'. In this case the scattering matrix elements scale as $|\Phi_{\lambda\lambda'\lambda''}|^2 \sim q'^2$. As the branches bunch together, q' and the matrix elements get smaller and the resulting aaa scattering becomes weaker. Interestingly, there is a competition between this matrix element reduction and an increase in the scattering rate prefactor terms, which contain $n_{\lambda'}^0/\omega_{\lambda'} \sim (1/q')^2$ for acoustic branches with small q'. Also, other factors such as the magnitudes of the anharmonic IFCs and the atomic masses enter into determining the scattering rates. Careful calculations are required to determine the scattering behavior for a given material.

Temperature Dependence: The intrinsic thermal conductivities of BAs and BSb have weaker temperature dependence than those of the other materials in FIG. 8. For low temperature, aao scattering is weak in all materials. In this case, the intrinsic κ values follow the prediction of conventional guidelines, i.e., materials with lighter atoms and stiffer bonds have higher intrinsic κ. Thus, at T=100K the intrinsic thermal conductivities are ordered: diamond, c-BN, BP, BAs and BSb. With increasing temperature, the onset of a-o scattering in diamond, BN and BP causes a faster drop in κ for these materials. At T=400K the intrinsic thermal conductivities are reordered: BAs, diamond, c-BN, BSb and BP.

Thermal Conductivity with Natural Isotope Mixtures: Phonon scattering by naturally occurring isotopes reduces κ. The relative strength of the phonon-isotope scattering compared to the intrinsic phonon-phonon scattering can be characterized by the percent isotope effect: $P=100(\kappa_{pure}/\kappa_{nat}-1)$. Excluding materials with the highest thermal conductivities, phonon-isotope scattering is typically much weaker than intrinsic phonon-phonon scattering around RT. As a result, the corresponding P is small. For example, in Si the RT P is about 8%, while in GaAs it is about 4%. In contrast, for high thermal conductivity materials such as diamond, the intrinsic phonon-phonon scattering is unusually weak. Then, scattering of phonons by isotopes can be comparable to the intrinsic scattering and can significantly reduce κ.

Figure 14:
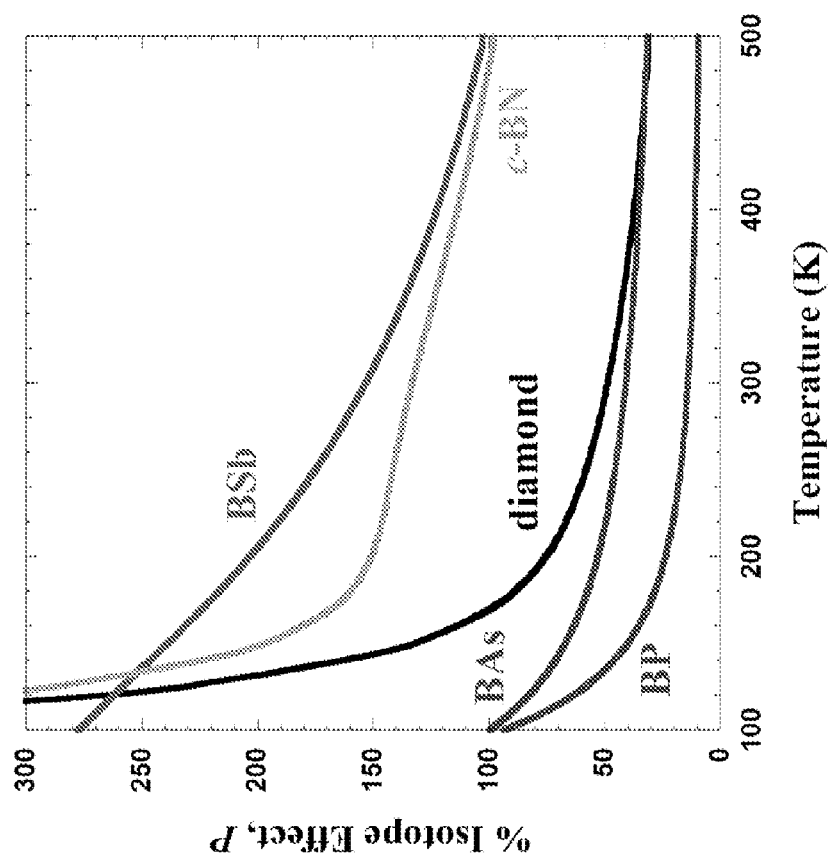
FIG. 14 is calculated isotope effect, $P=100(\kappa_{pure}/\kappa_{nat}-1)$, as a function of temperature for c-BN, BP, BAs, BSb, and diamond.

FIG. 14 plots the calculated P as a function of temperature for the BX materials and for diamond. Although natural carbon has a relatively small isotope mix (98.9% $^{12}$C, 1.1% $^{13}$C), the P value for diamond is large (50% at RT) because the stiff covalent bonding and light atomic mass give a high phonon frequency scale. As a result RT is an effectively low temperature compared to the Debye temperature in diamond, and the intrinsic phonon-phonon scattering is correspondingly weak. Around and above RT, P for c-BN is larger than that of diamond (130% at RT for c-BN) even though its frequency scale is lower. This difference reflects primarily the larger isotope mix in boron (19.9% $^{10}$B, 80.1% $^{11}$B) compared to that in carbon, which causes stronger phonon-isotope scattering in c-BN. In contrast, the P for BAs around and above room temperature is comparable to that of diamond and becomes considerably smaller than that of diamond well below room temperature. This is at first surprising since the large boron isotope mix also occurs in BAs as it does in c-BN. The weak phonon isotope scattering in BAs results from the large As to B mass ratio, which causes the motion of the heavy (and in this case isotopically pure) As atoms to dominate for high frequency acoustic phonons. For c-BN the constituent masses are similar and the motion of the boron atoms plays a significant role in the phonon-isotope scattering of the acoustic phonons. The much larger isotope effect for BSb compared to BAs reflects the large isotope mix on the heavy Sb atoms.

With decreasing temperature, the isotope effect in diamond increases more rapidly than in BAs. This reflects in part the weakening aao scattering in diamond which causes the intrinsic κ to rise faster than in BAs as seen in FIG. 8. In addition, the high frequency scale in diamond makes N scattering more important at low temperature than in BAs.

Figure 15:
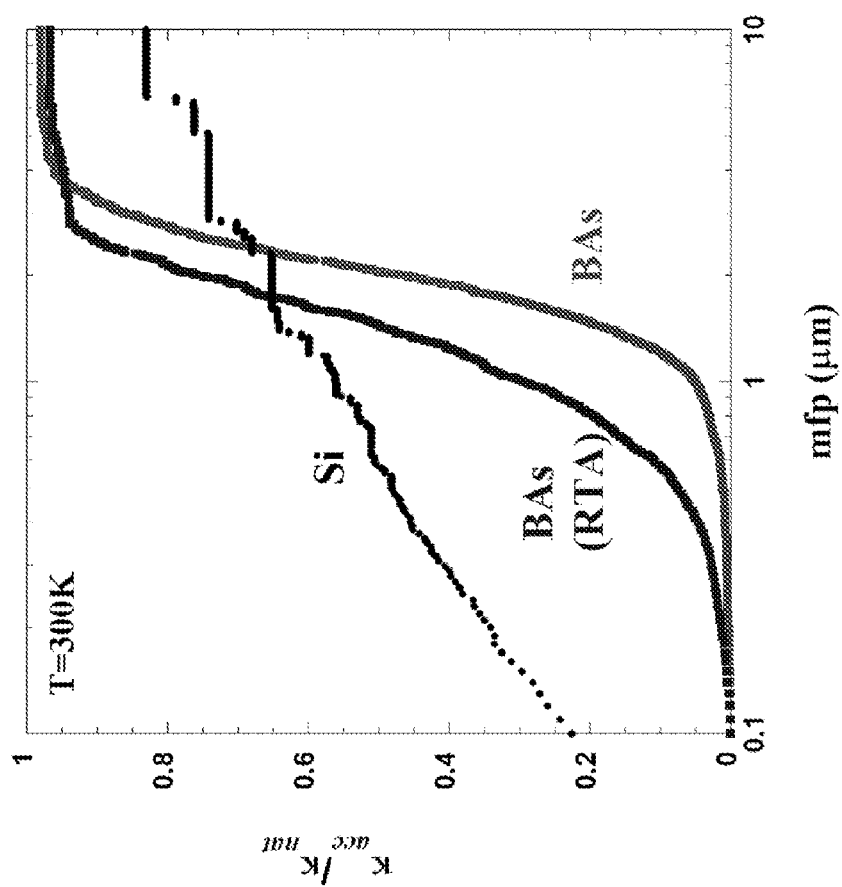
FIG. 15 presents calculated thermal conductivity accumulation, $\kappa_{acc}(l)$ at T=300K for naturally occurring isotope concentrations as a function of phonon mean free path for BAs and Si. $\kappa_{acc}(l)$ is scaled by the total $\kappa_{nat}$ in this case. The curve gives $\kappa_{acc}(l)/\kappa_{nat}$ for BAs in the relaxation time approximation (RTA).

Thermal Conductivity Accumulation: New measurement techniques are able to extract the accumulation of thermal conductivity as a function of the phonon mean free path (mfp), and good agreement between ab initio calculations and measurement have been obtained for Si. This accumulation provides insight into the nature of thermal transport in materials. The mfp of a phonon is defined in mode λ as $|v_\lambda|\tau_{\lambda z}$ with z along the direction of a cubic axis and temperature gradient. The thermal conductivity accumulation is:

$$\kappa_{acc}(l) = \sum_\lambda C_\lambda v_{\lambda z}^2 \tau_{\lambda z} \theta(l - |v_\lambda|\tau_{\lambda z}) \quad (2)$$

where θ(x) is the Heaviside step function which is zero (one) for x<0 (x>0). $\kappa_{acc}(l)$ sums the fraction of heat carried by phonons with mfps smaller than l. FIG. 15 shows $\kappa_{acc}(l)$ at RT for Si and BAs with naturally occurring isotope concentrations. The values are scaled by the total $\kappa_{nat}$ for each material. For Si (thick curve), the accumulation is spread over more than three orders of magnitude of mfps with 80% lying in the wide range 0.05 μm<l<20 μm, and with the 50% total accumulation point occurring near 0.6 μm. These results are in good agreement with previous ab initio calculations and with measured values. On the other hand, for BAs the accumulation is over a much narrower range: 80% of the accumulation occurs for 1.2 μm<l<3.3 μm, and it is shifted to larger mfps with the 50% accumulation point occurring at 2 μm. These differences can be understood qualitatively as follows: For Si, the main contributions to κ come in the frequency range below 6 THz where these contributions are roughly constant. The increasingly strong scattering rates (see FIG. 10 for TA$_1$ phonons) cause acoustic phonon scattering times $\tau_{\lambda z}$ to decease rapidly over this frequency range giving the observed wide range of mfps contributing to the Si thermal conductivity accumulation. In contrast, acoustic branch bunching in BAs gives decreased scattering rates in the mid to high range of acoustic phonon frequencies (see FIG. 10 for TA$_1$ phonons), which keeps the corresponding $\tau_{\lambda z}$ larger than those in Si and within a narrower lifetime range. This focuses accumulation contributions at larger mfps and within the narrow mfp range seen in FIG. 15.

FIG. 15 shows the scaled $\kappa_{acc}(l)$ for BAs in the relaxation time approximation (RTA) to the phonon BTE. In the RTA the phonon lifetimes are taken from Matheissen's rule: $1/\tau_\lambda^{RTA}=1/\tau_\lambda^N+1/\tau_\lambda^U+1/\tau_\lambda^{iso}$ where $1/\tau_\lambda^N$ and $1/\tau_\lambda^U$ are the intrinsic scattering rates for Normal and Umklapp, respectively. This incorrectly treats N processes as resistive, which artificially increases the thermal resistance and shifts the accumulation to smaller mfps. Further, the calculated $\kappa_{nat}$ within the RTA is about 40% smaller than the full solution to the BTE. This highlights the importance of implementing the full iterative solution to the BTE.

Figure 16:
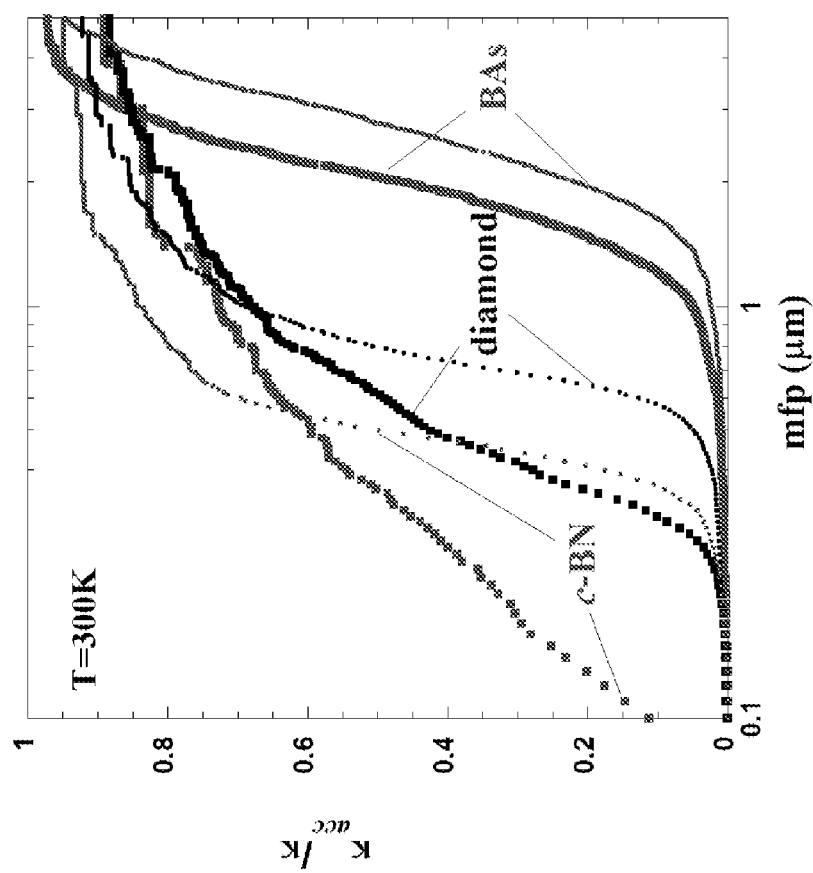
FIG. 16 presents calculated $\kappa_{acc}(l)/\kappa$ at T=300K for naturally occurring isotope concentrations (thick curves) and isotopically pure (thin curves) for BAs, diamond and c-BN as a function of phonon mean free path.

FIG. 16 compares the $\kappa_{acc}(l)/\kappa$ for BAs, diamond and c-BN with naturally occurring isotope concentrations (thicker curves) with those for the isotopically pure materials (thinner curves). For the pure case, the accumulation in diamond occurs at smaller mfps than for BAs. This seems at first contradictory since the RT $\kappa_{pure}$ values for diamond and BAs are about the same. The explanation is as follows: The acoustic phonon group velocities in diamond are larger than those in BAs. But the largest contributions to the diamond κ occur at high frequencies where the acoustic phonon lifetimes are relatively small. On the other hand, the largest κ contributions in BAs come in a narrow region of lower frequencies where the corresponding lifetimes are larger. The mfp for mode λ, $|v_\lambda|\tau_{\lambda z}$, is linear in the velocity, but the thermal conductivity integrand is quadratic in the velocity. This larger velocity weighting gives diamond similar κ to BAs even though the contributing mfps are smaller.

The effect on $\kappa_{acc}(l)$ of phonon-isotope scattering in diamond and c-BN is markedly different than it is in BAs. In diamond and c-BN, the acoustic phonon-isotope scattering rates are weak at low frequency and increase rapidly and monotonically with increasing frequency, flattening out near the maximum acoustic phonon frequencies where they approach (diamond) or exceed (c-BN) the RT phonon-phonon scattering rates. As a result, contributions from the higher frequency (small mfp) phonons are suppressed and shifted to even smaller mfps, while the fractional contributions to $\kappa_{acc}(l)$ increase for the lower frequency (large mfp) phonons, as seen in FIG. 16. Similar behavior has been noted in $Mg_2Si_xSn_{1-x}$ alloys. In BAs the acoustic-phonon-isotope scattering rates are weak with roughly constant peak values in a narrow frequency range (see FIG. 20 for $TA_1$ phonons) that coincides with the peak contributions to $\kappa_{pure}$. This causes the full accumulation curve to be rigidly shifted to smaller mfp. The weakness of this isotope scattering ensures that this shift is relatively small.

The large lifetimes in the narrow region of higher acoustic phonon frequencies gives an unusual distribution of per branch contributions to the thermal conductivity in BAs. For conventional high $\kappa$ materials, the RT per branch contributions decrease with increasing frequency, i.e., in going from $TA_1$ to $TA_2$ to LA. Thus, for diamond (c-BN), the fractional contributions to the RT $\kappa_{nat}$ from these three branches are: 0.41 (0.45), 0.34 (0.31), 0.25 (0.24). This trend is a consequence of the high frequency scales in diamond and c-BN (maximum acoustic phonon frequencies for diamond and c-BN are 5.8 and 4.9 times larger than the RT thermal energy, respectively), which gives a reduction in RT acoustic phonon population with increasing frequency. In contrast, the acoustic phonon frequency range in BAs extends to only 50% higher phonon energy than the RT thermal energy, and roughly the same per branch contributions might be expected. However, for BAs the fractional contributions to the RT $\kappa_{nat}$ for $TA_1$ to $TA_2$ to LA are: 0.25, 0.49, and 0.26, which shows that the $TA_2$ contribution is twice as large as those from $TA_1$ and LA. This anomalously large $TA_2$ contribution occurs because of a coincidence of large $TA_2$ group velocities with large $TA_2$ phonon lifetimes.

To summarize this section, the majority of heat transported in BAs comes from large mean free path phonons within a narrow range of mfps. The accumulation of thermal conductivity as a function of phonon mfp in BAs is not much affected by phonon-isotope scattering.

Sensitivity to Boundary Scattering: The large mfps of phonons carrying heat in BAs and the narrow range over which they are distributed make the acoustic phonons sensitive to scattering from crystal boundaries. An estimate of this effect can be obtained by including a boundary scattering rate: $1/\tau_\lambda^b = |v_\lambda|/L$ where L gives a qualitative measure of the crystal size.

Figure 17:
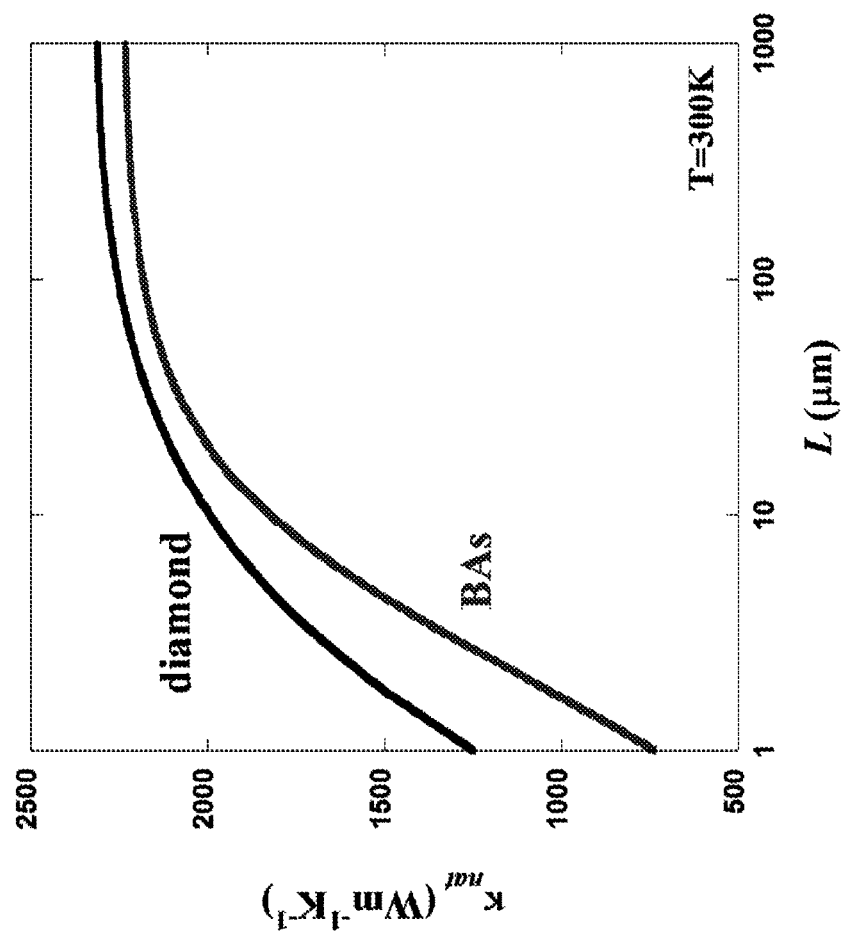
FIG. 17 presents calculated $\kappa_{nat}$ at T=300K for diamond and BAs as a function of boundary scattering length, L, which gives a qualitative measure of the crystal size. The $\kappa$ of BAs is more sensitive to scattering from crystallite boundaries.

FIG. 17 compares the RT $\kappa_{nat}$ values for BAs with those of diamond as a function of L. Below about 10 μm, the $\kappa_{nat}$ for BAs drops more rapidly than that for diamond. Diamond also has $\kappa$ accumulation over a narrow range of mfps, but it is concentrated at mfps less than half those for BAs (50% accumulation occurs at around 0.8 μm for diamond). As a result, the diamond thermal conductivity drops less rapidly with the boundary scattering length than does that of BAs.

Coefficient of Thermal Expansion: Materials used for passive cooling applications must have coefficients of thermal expansion (CTEs) that closely match those of the sensitive electronics they are designed to cool in order to prevent thermal stresses. Therefore, it is important to examine the CTE of BAs compared to commonly used materials in microelectronic devices, in particular silicon. Within the quasi-harmonic approximation, the CTE is given by:

$$CTE = \frac{1}{3B_0} \sum_\lambda C_\lambda \gamma_\lambda \quad (3)$$

where $B_0$ is the bulk modulus determined from the harmonic IFCs, and $\gamma_\lambda$ is the mode Grüneisen parameter, which can be expressed as:

$$\gamma_\lambda = -\frac{V}{\omega_\lambda} \frac{d\omega_\lambda}{dV} \quad (4)$$

$$= -\frac{1}{6\omega_\lambda^2} \sum_k \sum_{l'k'} \sum_{l''k''} \sum_{\alpha\beta\gamma} \Phi_{\alpha\beta\gamma}(0k, l'k', l''k'')$$

$$\frac{e_{\alpha k}^{\lambda*} e_{\beta k'}^\lambda}{\sqrt{\bar{m}_k \bar{m}_{k'}}} e^{iq \cdot R_{l'}} r_{l''k''\gamma}$$

where lk designates the $k^{th}$ atom in the $l^{th}$ unit cell, $e_{\alpha k}^\lambda$ and $\bar{m}_k$ are the $\alpha^{th}$ component of the phonon eigenvector and isotope averaged atomic mass of that atom, and the terms $\Phi_{\alpha\beta\gamma}(lk,l'k',l''k'')$ are the third order anharmonic IFCs. $R_l$ and $r_{lk\alpha}$ are the lattice vector and the $\alpha^{th}$ component of the vector locating the $k^{th}$ atom in the $l^{th}$ unit cell. The calculated values obtained for $B_0$ are 1.57 Mbar (BAs) and 1.00 Mbar (Si). The calculated room temperature CTE value $2.72 \times 10^{-6} K^{-1}$ for Si is in good agreement with the corresponding measured value, $2.6 \times 10^{-6} K^{-1}$. The calculated RT CTE for BAs of $3.04 \times 10^{-6} K^{-1}$ is close to that of Si. By comparison, for diamond we obtain $B_0 = 4.42$ Mbar and a RT CTE value of $1.02 \times 10^{-6} K^{-1}$, again close to the measured value of $1.1 \times 10^{-6} K^{-1}$ but almost three times smaller than the RT CTE value for Si, suggesting that BAs may be a better candidate for thermal management in Si-based devices than diamond.

Other Materials: The findings here suggest that the combination of large a-o gap and acoustic branch bunching should be considered in addition to the four commonly used criteria discussed in Section II when searching for high $\kappa$ materials. The surprisingly high $\kappa$ of BAs prompts the question: Are there other materials that also should exhibit anomalously high $\kappa$ for similar reasons? A seemingly promising prospect is c-GaN. Ga (N) is opposite As (B) across the group IV column of the periodic table, and GaN has a large mass ratio of constituent atoms, which gives a large a-o gap.

Figure 18:
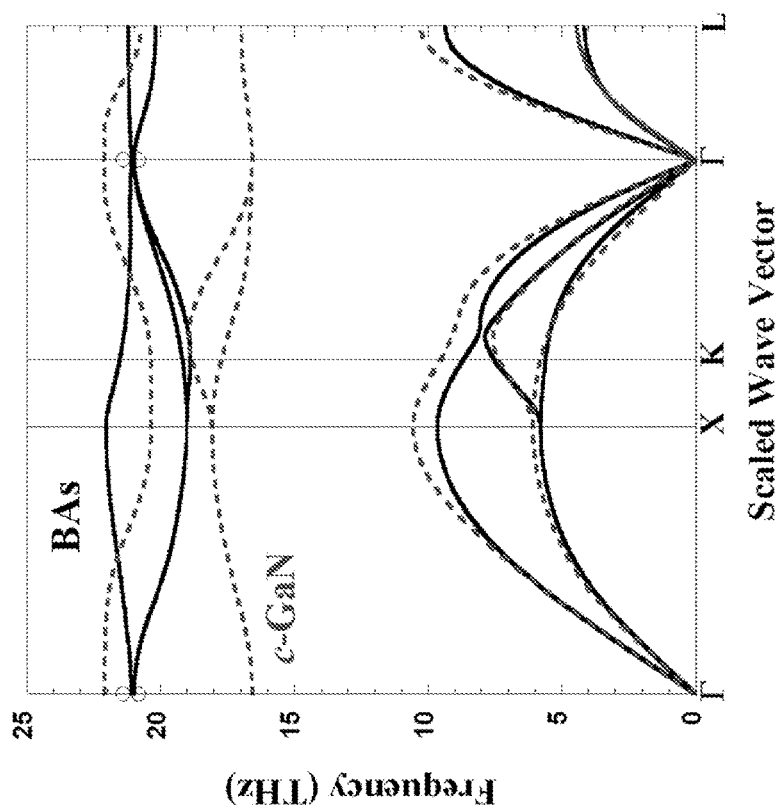
FIG. 18 presents calculated phonon dispersions for BAs (solid curves) and c-GaN (dashed curves) in the high symmetry directions. Experimental data for BAs are given by the open black circles.
Figure 19:
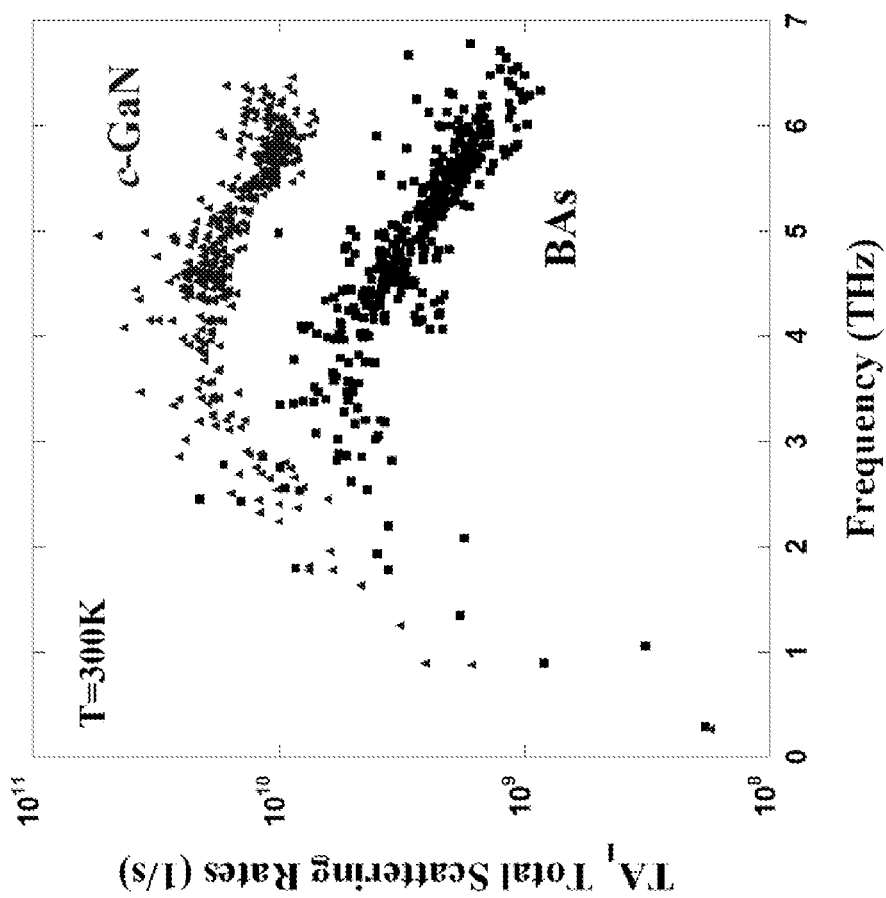
FIG. 19 presents anharmonic three-phonon scattering rates for the $TA_1$ branch at T=300K for BAs (squares) and c-GaN (triangles) as a function of phonon frequency.

FIG. 18 compares the phonon dispersions for BAs and c-GaN. The $TA_1$ and $TA_2$ branches almost exactly coincide and both TA and LA acoustic velocities near the center of the Brillouin zone are similar. However, in the higher acoustic frequency range, the LA branch for c-GaN lies at higher frequencies, which gives a larger phase space for aaa phonon-phonon scattering and stronger three-phonon scattering matrix elements. Also, c-GaN has a smaller mass ratio ($M_{Ga}/M_N = 4.98$) than does BAs ($M_{As}/M_B = 6.93$), which gives a smaller frequency gap between the TO branches and the acoustic phonons in c-GaN compared to BAs. This introduces aao scattering in c-GaN, which is absent in BAs. Further, the calculated anharmonic IFCs of c-GaN are larger than those of BAs, and these are squared in the three-phonon matrix elements that determine the scattering rates. The above differences give increased intrinsic anharmonic scattering rates in c-GaN compared to BAs. This is illustrated in FIG. 19 for the $TA_1$ branch in each material. As a result, the calculated intrinsic κ of c-GaN, $\kappa_{pure}$=360 Wm$^{-1}$K$^{-1}$, is almost an order of magnitude smaller than that in BAs.

Figure 20:
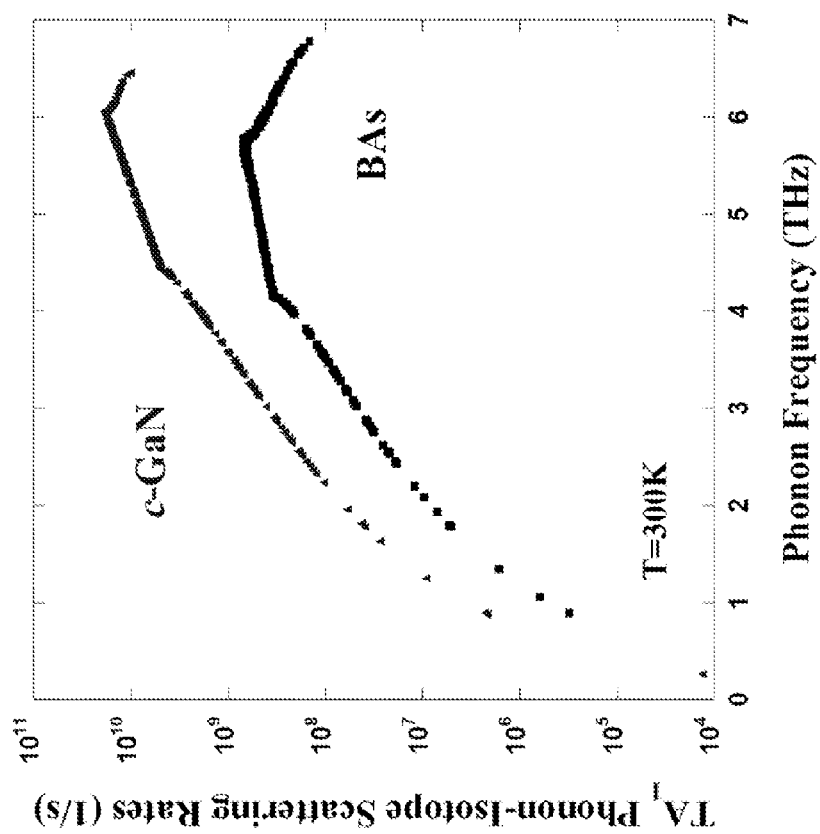
FIG. 20 presents phonon-isotope scattering rates for the $TA_1$ branch at T=300K for BAs (squares) and c-GaN (triangles) as a function of phonon frequency. c-GaN has larger isotope scattering rates than BAs despite the larger mass variance of boron compared to gallium.

Further, there is a large isotope mix in c-GaN on the heavier (Ga) atom, which gives much stronger phonon-isotope scattering rates in c-GaN than in BAs, as shown in FIG. 20 for the TA$_1$ phonons in each material. This is in spite of the fact that the mass variance parameter, a multiplicative factor in the isotope scattering rate, is about seven times larger in BAs. The strong phonon-isotope scattering in c-GaN gives a large reduction of its intrinsic thermal conductivity to $\kappa_{nat}$=215 Wm$^{-1}$K$^{-1}$. The significantly lower κ of c-GaN highlights the sensitivity of the thermal conductivity to the a-o gap, the acoustic branch bunching, the magnitude of the anharmonic IFCs and the isotope composition of the constituent atoms in each material.

Example 4

Enhancement in Thermal Conductivity Due to Isotopic Purification

The background information for Example 4 is described in "Phonon-isotope scattering and thermal conductivity in materials with a large isotope effect: A first-principles study," PHYSICAL REVIEW B 88, 144306 (2013), which is incorporated herein by reference in its entirety.

In the results presented here, scattering of phonons from crystal boundaries was ignored, and $\kappa_{pure}$ was calculated in the absence of any isotopic impurities. In real materials, phonons can scatter from boundaries, and isotopic purification is never complete. Both of these factors reduce the thermal conductivity, making our calculated $\kappa_{pure}$ values upper bounds to corresponding measured values. However, it is noted that isotopically purified materials typically have less than 0.1% isotope mixtures and that for high quality crystals, boundary scattering is important only at low temperature, so the calculated $\kappa_{pure}$ values around and above RT should give an accurate representation of measured values of κ for isotopically purified systems.

To test the effect of boundary scattering, an empirical boundary scattering term, $1/\tau_\lambda^B=|v_\lambda|/L$, was included in the BTE calculation of κ for GeC and for BeSe, where L gives the effective grain size. Without boundary scattering, κ diverges with decreasing temperature, T. At low enough T boundary scattering becomes dominant, and κ peaks and decreases with decreasing T. For L=1 mm, $\kappa_{pure}$ is insensitive to boundary scattering for T>75K and T>50K and peaks at T=30K and T=20K in GeC and BeSe, respectively. For L=0.1 mm, the peaks are suppressed and shift to 50K and 40K in GeC and BeSe, respectively. Also for L=0.1 mm, the boundary scattering plays a role in determining $\kappa_{pure}$ up to ~100K for both systems. The following results do not include the effects of boundary scattering.

Figure 22:
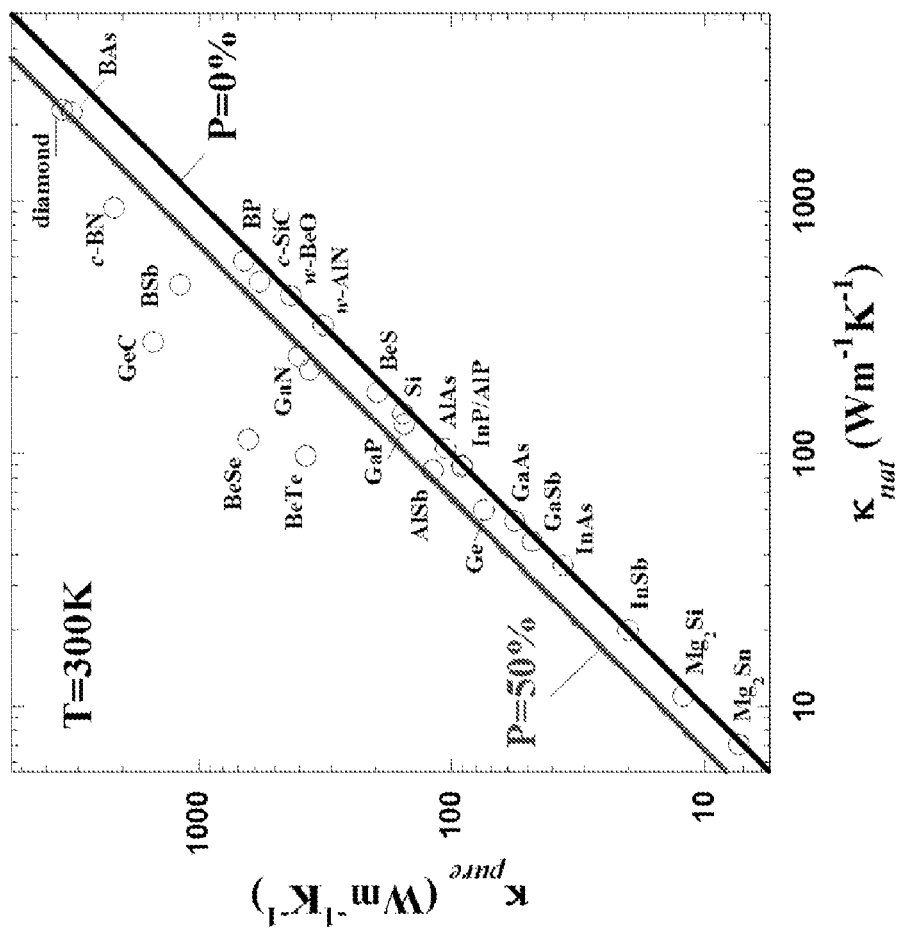
FIG. 22 presents calculated room temperature $\kappa_{pure}$ vs. $\kappa_{nat}$ for a host of systems using the first principles Boltzmann transport equation approach discussed in this work. The black line corresponds to no isotope effect, P=0%, and the red line corresponds to a large isotope effect, P=50%. We identify diamond, c-BN, BSb, GeC, BeSe, BeTe, and both cubic and wurtzite GaN as being 'large isotope effect' materials.

In FIG. 22, calculated RT $\kappa_{pure}$ vs. $\kappa_{nat}$ is provided for a number of elemental and compound semiconductors and insulators calculated using the first principles approach. Materials near the black line (P=0%) have very small isotope effects. Materials near or above the P=50% line to be 'large isotope effect' systems. The focus of the results and discussion below will be on these materials.

Figure 23:
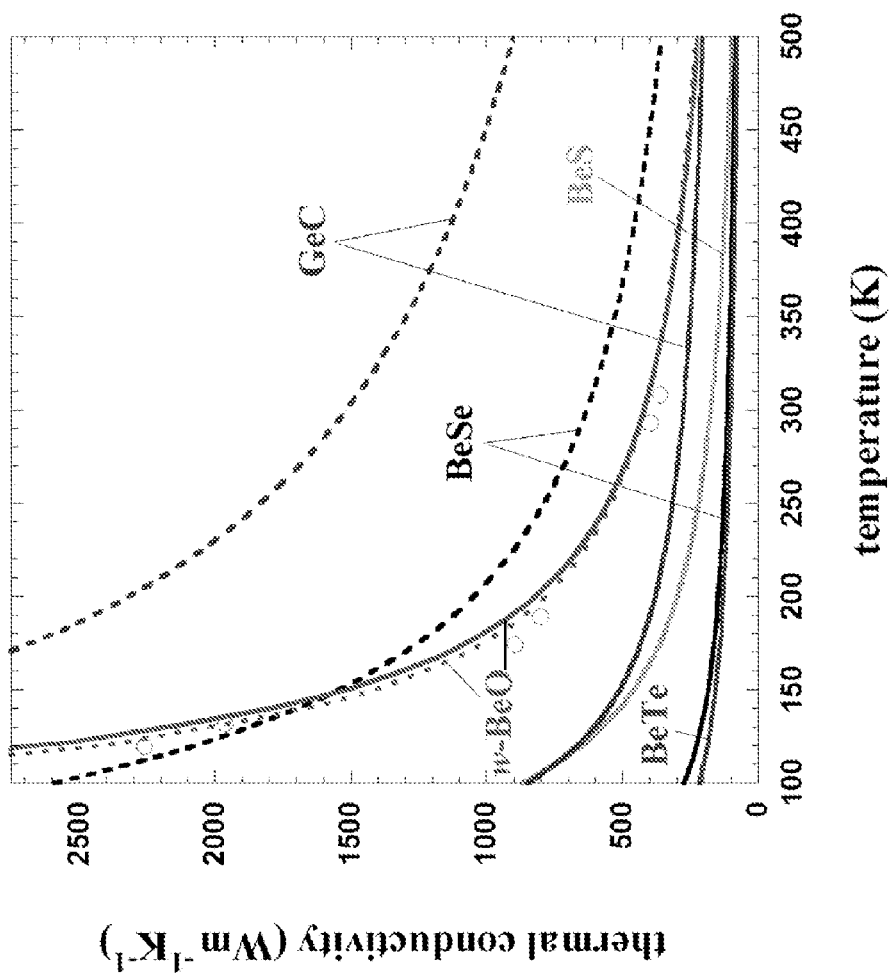
FIG. 23 presents calculated $\kappa_{nat}$ vs. temperature for w-BeO (solid for $\kappa_{in}$ and dotted for $\kappa_{out}$), BeS, BeSe, BeTe, and GeC. The dashed curves give the calculated $\kappa_{pure}$ for BeSe and GeC. The green circles are experimental data for w-BeO.

FIG. 23 gives the calculated κ vs. temperature for w-BeO (green), BeS (orange), BeSe (black), BeTe (red), and GeC (purple). The solid curves correspond to κ for materials with naturally occurring isotopic abundances, $\kappa_{nat}$, and the dashed curves are for isotopically pure materials, $\kappa_{pure}$. Calculated RT values of $\kappa_{pure}$ and $\kappa_{nat}$ are also given in Table 3, presented in FIG. 21. Table 3 presents atomic masses, mass variance parameter ($g_k$), and calculated $\theta_D$ are given for each listed material. In the table, k=1 for the first atom in each binary material listed in the first column, and k=2 for the second atom. The calculated RT $\kappa_{pure}$, $\kappa_{nat}$, $\kappa_{pure}/\kappa_{pure}^{RTA}$ and isotope effect, $P=(\kappa_{pure}/\kappa_{nat}-1)\times 100\%$, are given for the each material considered in this work. Enhancements to isotope scattering through the atomic motion occur in materials with a large mass mismatch between the constituent atoms and a large $g_k$ on the heavier atom. $P_{RTA}$ is the isotope effect given by the relaxation time approximation (RTA). The $\kappa_{nat}$ in parenthesis are calculated using the approximate expression for the isotope scattering rates, Eq. 1, for the cubic compounds. Value marked a-e are as follows: a) In-plane value; b) From L. Lindsay, D. A. Broido, and T. L. Reinecke, Phys. Rev. B 87, 165201 (2013); c) From D. A. Broido, L. Lindsay, and A. Ward, Phys. Rev. B 86, 115203 (2012); d) From L. Lindsay, D. A. Broido, and T. L. Reinecke, Phys. Rev. Lett. 111, 025901 (2013); and e) From A. AlShaikhi, S. Barman, and G. P. Srivastava, Phys. Rev. B 81, 195320 (2010) and L. Lindsay, D. A. Broido, and T. L. Reinecke, Phys. Rev. B 87, 165201 (2013).

With decreasing temperature the intrinsic anharmonic phonon-phonon scattering becomes weaker giving increasing κ for all materials. $\kappa_{pure}$ for GeC is far larger than those of the other materials as shown in FIG. 23. Diamond's calculated RT $\kappa_{pure}$ and $\kappa_{nat}$ (see Table I) are the highest of any bulk material and are in good agreement with measured values. The next highest measured RT κ is that of c-BN with κ=768Wm$^{-1}$K$^{-1}$. Large RT values of $\kappa_{pure}$ (over 1000Wm$^{-1}$K$^{-1}$) have also been recently predicted for BAs, c-BN and BSb. The RT $\kappa_{pure}$ for GeC (about 1500Wm$^{-1}$K$^{-1}$) is three times larger than that predicted for its cousin material, c-SiC, and two times smaller than that for diamond (see Table 3). This is intriguing since conventional evaluation criteria would predict a monotonic decrease in $\kappa_{pure}$ in going from diamond to SiC to GeC. This unconventional behavior also applies for the beryllium-VI compounds and has been recently addressed in the context of boron-based III-V compounds.

Figure 24:
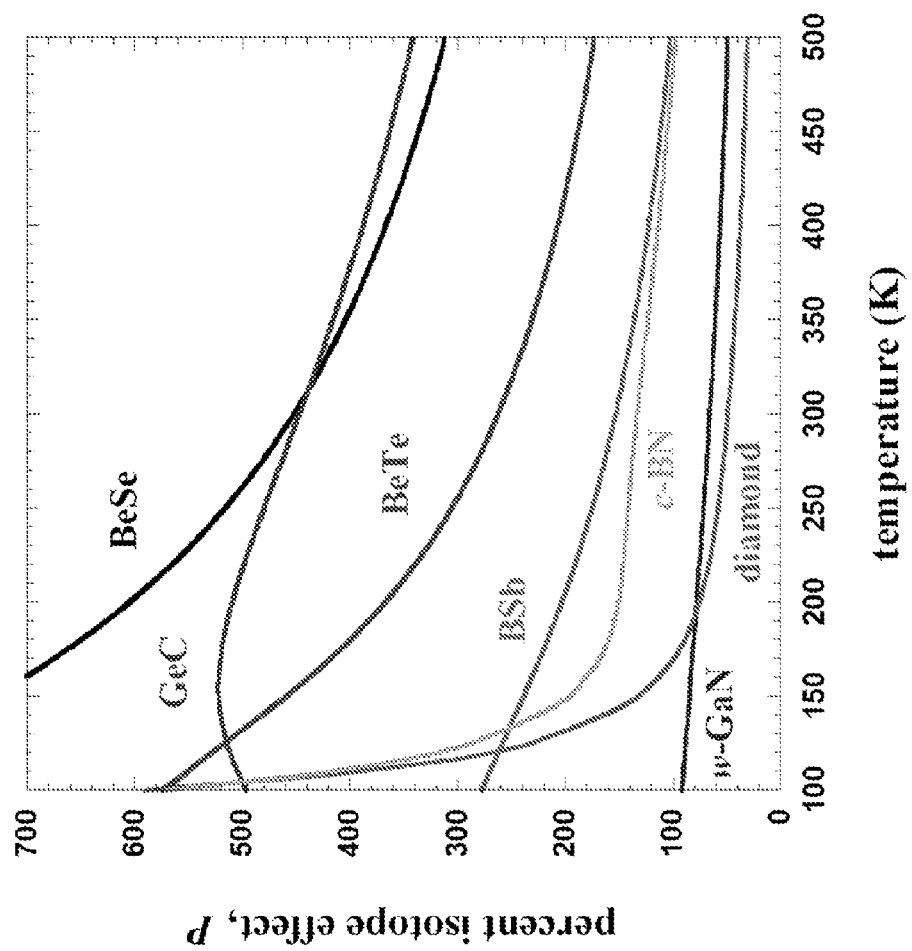
FIG. 24 presents calculated isotope effect, $P=(\kappa_{pure}/\kappa_{nat}-1)\times 100\%$, vs. temperature for GeC, BeSe, BeTe, c-BN, BSb, diamond, and w-GaN.

Another notable aspect in FIG. 23 is the large separation of $\kappa_{pure}$ and $\kappa_{nat}$ for GeC and for BeSe over the entire temperature range. The RT thermal conductivities of these materials decrease by more than a factor of five with the inclusion of phonon-isotope scattering. To highlight this behavior, the calculated isotope effect, P, vs. temperature is shown in FIG. 24 for all of the large isotope effect materials identified in FIG. 22. The calculated RT P for these materials and the beryllium-VI compounds are listed in Table I. The calculated P for diamond is in good agreement with the measured value P=50%, which is the highest measured RT isotope effect of any bulk material. BeSe and GeC have by far the highest calculated P of all the materials at 450%. We note that diamond, c-BN and GeC have very large absolute changes in κ with isotope purification with $\kappa_{pure}$-$\kappa_{nat}$ ranging from 1160Wm$^{-1}$K$^{-1}$ to 1240Wm$^{-1}$K$^{-1}$.

While the phonon-isotope scattering is temperature independent, the strength of the phonon-phonon scattering increases with temperature through the Bose factors. It is useful to scale the temperature dependence of P using the Debye temperature, $\theta_D$, of each material to account for the different phonon frequency ranges. This is done in FIG. 25. The calculated $\theta_D$ of each material is given in Table 3. The large RT isotope effect of diamond is primarily a consequence of its high frequency scale compared to the thermal energy. At half its Debye temperature, P is relatively small at about 15%, not much larger than that of Si at half its Debye temperature. In contrast, the P for BeSe at half its Debye temperature is over 500%.

Figure 25:
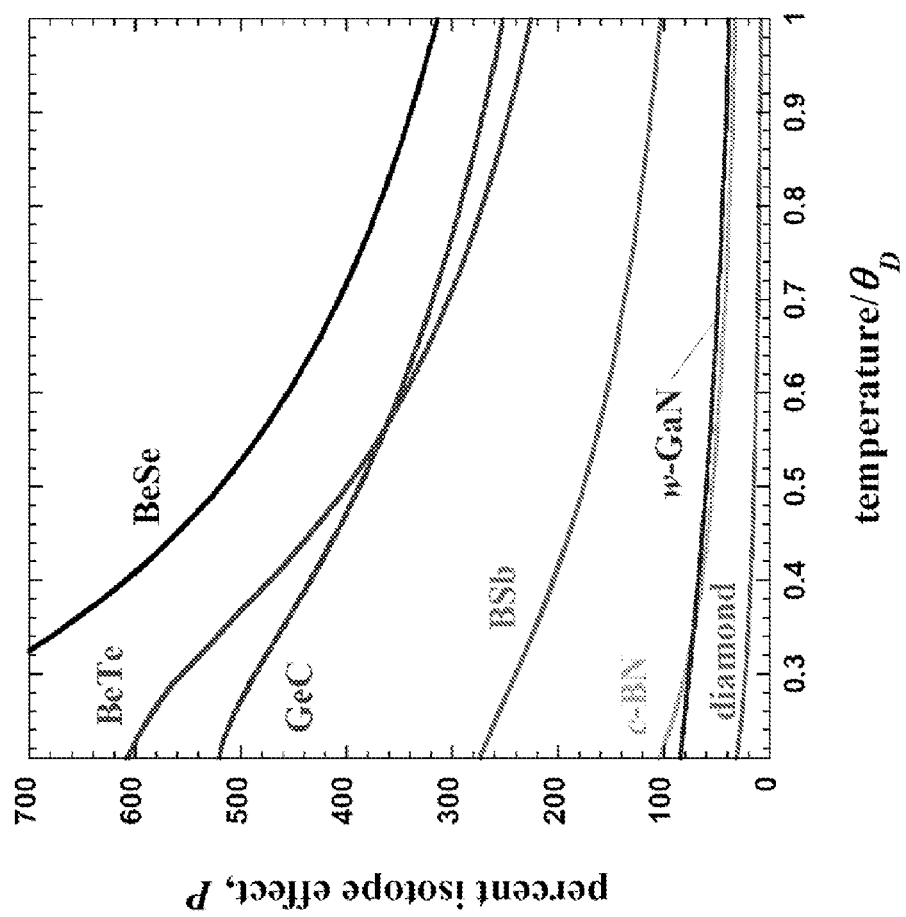
FIG. 25 presents calculated isotope effect, $P=(\kappa_{pure}/\kappa_{nat}-1)\times 100\%$, vs. scaled temperature for GeC, BeSe, BeTe, c-BN, BSb, diamond, and w-GaN. The temperature is scaled by the Debye temperature, $\theta_D$, for each material (see Table 3 in FIG. 21).

For all of the materials in FIG. 24 and FIG. 25, the isotope effects are the result of an interplay between the isotope scattering and phonon-phonon scattering, and larger isotope effects result when the former is strong relative to the latter, as is discussed in detail below.

Figure 26:
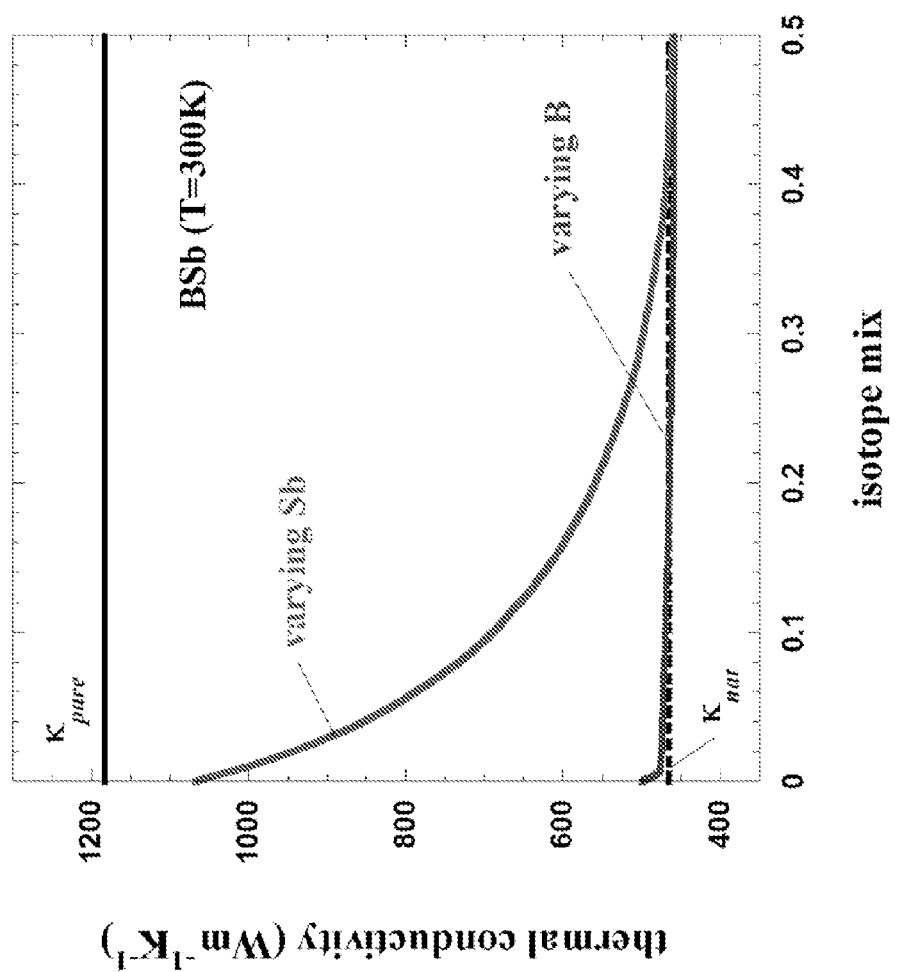
FIG. 26 presents calculated RT $\kappa$ vs. isotope mixture for BSb. The Varying Sb curve gives $\kappa$ using constant $g_B=13.7\times 10^{-4}$ for natural boron concentrations and varying Sb isotope mixtures (x axis gives the $^{123}$Sb concentration). The Varying B curve gives $\kappa$ with constant $g_{Sb}=0.66\times 10^{-4}$ for natural antimony concentrations and varying B isotope mixtures (x axis gives the $^{10}$B concentration). The solid and dashed lines give $\kappa_{pure}$ and $\kappa_{nat}$ for BSb, respectively.

Strong Phonon-Isotope Scattering: In compound materials, a large mass ratio between the constituent atoms and a large mass variance on the heavy atom give enhanced phonon-isotope scattering through the atomic motion. For example, BSb has large natural isotopic mixtures for both boron (19.9% $^{10}$B, 80.1% $^{11}$B) and antimony (57.2% $^{121}$Sb, 42.8% $^{123}$Sb). In BSb, the light atom has a mass variance parameter, $g_B=13.7\times10^{-4}$, that is twenty times larger than that of the heavy atom, $g_{Sb}=0.66\times10^{-4}$. It is noted that B has a smaller isotope mixture and larger $g_k$ than Sb due to the much smaller average mass of B. FIG. 26 gives the calculated RT κ vs. isotope mixture for BSb. The Varying Sb curve gives κ with the naturally occurring B concentrations and varying Sb concentrations. The Varying B curve gives κ with the naturally occurring Sb concentrations and varying B concentrations. The variation in the Sb isotope mixture has a very large effect on κ of BSb (green curve), which drops more than a factor two in going from isotopically pure Sb to a 50/50 mixture. In contrast, the variation of the B isotope mixture has relatively little effect on κ of BSb (Varying B curve). Similarly, the natural C isotope mixture has very little effect on $κ_{nat}$ of GeC, while inclusion of the natural Ge isotope mixture causes $κ_{pure}$ of GeC to decrease more than five times.

In BSb, the scattering of heat-carrying acoustic phonons from Sb isotopes is significantly enhanced because the atomic motion for these phonons is dominated by the heavy Sb atoms. This enhancement manifests itself through the squared amplitude of the atomic motion terms, $|ê_k^\lambda|^2$, in Eqs. 1. Since $|ê_k^\lambda|^2$ two terms multiply in the isotope scattering rates, the following discussion will be in terms of $|ê_k^\lambda|^4$. For elemental materials with two unit cell atoms $|ê_k^\lambda|^4=0.25$ throughout the entire Brillouin zone because the atomic motion is equally shared by the identical unit cell atoms. For long-wavelength acoustic vibrations in compound materials, $|ê_k^\lambda|^4=(\overline{m}_h/M_{cell})^2$ where $\overline{m}_h$ ($\overline{m}_l$) corresponds to the heavy (light) atom and $$M_{cell} = \sum_k \overline{m}_k$$

is the unit cell mass. For short-wavelength phonons at the Brillouin zone boundary only the heavy (light) atoms vibrate for the acoustic (optic) modes. For BSb, $|ê_{Sb}^\lambda|^4$ ranges from 0.84 at the zone center to 1.00 at the zone boundary, while $|ê_B^\lambda|^2$ ranges from 0.01 to 0.00. The significantly larger $|ê_{Sb}^\lambda|^4$ factor makes phonon scattering from Sb isotopes more important than that from B isotopes, as seen in FIG. 26. Though BSb has a large isotope effect, P=153, it is nearly three times smaller than that in GeC, despite GeC having a slightly lower $|ê_{Ge}^\lambda|^4$, ranging from 0.74 to 1.00. The main cause for this difference is the large mass variance parameter for Ge, $g_{Ge}=5.87\times10^{-4}$, compared to Sb, $g_{Sb}=0.66\times10^{-4}$. The large Ge mass variance parameter gives significantly enhanced phonon-isotope scattering in GeC, and thus a larger isotope effect than in BSb.

For binary cubic compounds with a large mass ratio of the constituent atoms, the phonon-isotope scattering rates, pho-non-isotope scatter rates can be accurately approximated by that for a monotonic cubic crystal:

$$1/\tau_\lambda^{iso} \approx \frac{\pi}{6} g_{eff} \omega^2 \Omega D(\omega) \qquad (1)$$

with an effective mass variance parameter, $$g_{eff} = \sum_k g_k \overline{e}_k^4,$$

with $g_h$ ($g_l$) being the mass variance parameter of the heavy (light) atom and $\overline{e}_h=\sqrt{(1+\overline{m}_h/M_{cell})/2}$ ($\overline{e}_l=\sqrt{(\overline{m}_l/2M_{cell})}$) a mode averaged magnitude of the phonon eigenvector for the heavy (light) atom. Note that unlike Eqs. 1, the approximate result, Eq. 1, does not depend on the phonon mode, but depends only on the phonon frequency, a distinct calculational advantage. Using this approximation for BSb gives a RT $κ_{nat}=466$ Wm$^{-1}$K$^{-1}$, very close to the value obtained in Table I. The RT $κ_{nat}$ determined using Eq. 1 for each of the binary cubic compounds is given in parentheses in Table 3. This approximation works well for many of the other materials, but breaks down for c-BN due to the small mass difference between its constituent atoms.

Figure 27A:
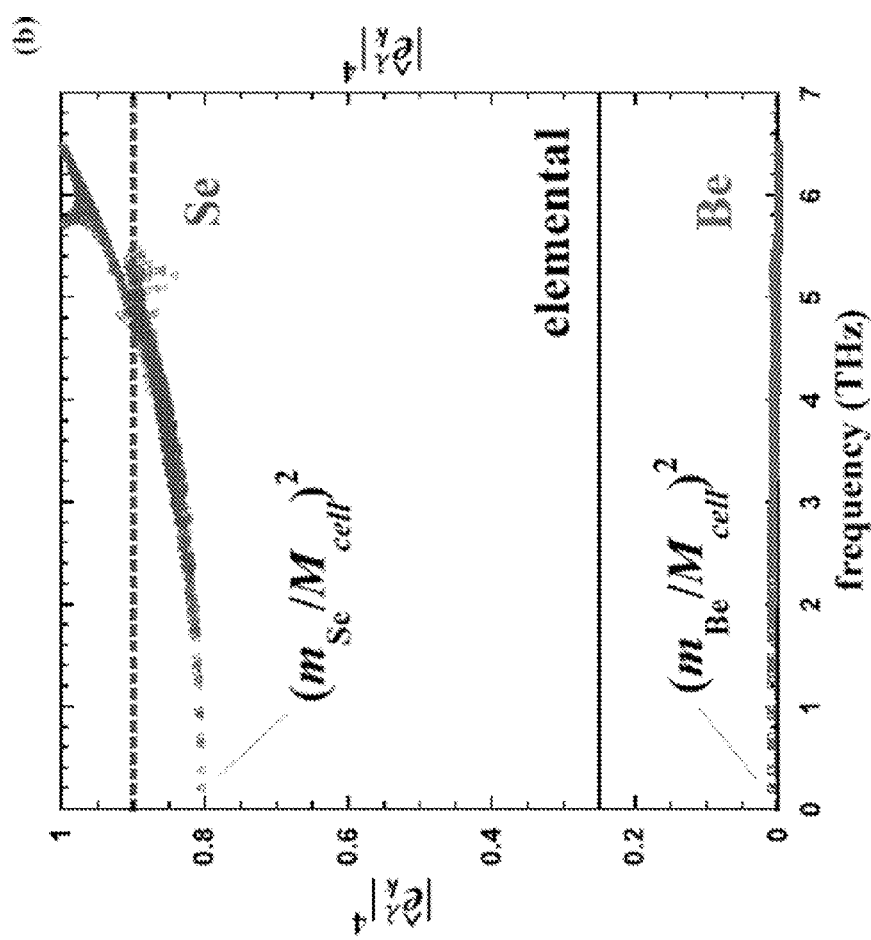
FIG. 27A and FIG. 27B present $|\hat{e}_k^\lambda|^4$ vs. frequency for BeSe. The triangles are $|\hat{e}_{Se}^\lambda|^4$ and the squares are $|\hat{e}_{Be}^\lambda|^4$. The solid line gives $|\hat{e}_k^\lambda|^4$ for elemental materials and the dashed lines give $\bar{e}_{Se}^4$ and $\bar{e}_{Be}^4$, respectively, which are used in the approximate isotope scattering rates.
Figure 27B:
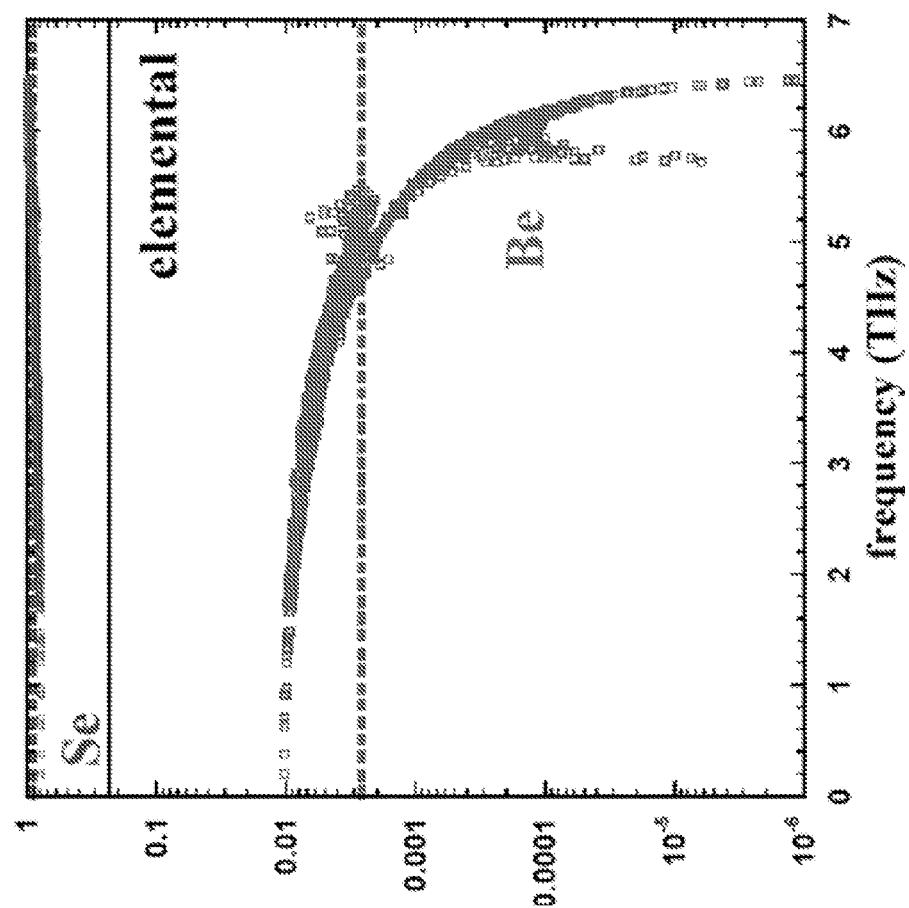

In FIG. 27A, FIG. 27B, FIG. 27C, and FIG. 27D, this approximation, Eq. 1, is tested and further illustrate the effect of the asymmetry of the atomic motion on the RT phonon-isotope scattering and κ of BeSe. The lighter Be atoms are isotopically pure, while Se has a relatively large mass variance $g_{Se}=4.62\times10^{-4}$ from a varied isotopic mixture (0.89% $^{74}$Se, 9.37% $^{76}$Se, 7.63% $^{77}$Se, 23.77% $^{78}$Se, 49.61% $^{80}$Se, 8.73% $^{82}$Se). FIG. 27A (linear y-axis) and FIG. 27B (log y-axis) give $|ê_{Se}^\lambda|^4$ (red triangles) and $|ê_{Be}^\lambda|^4$ (green squares) vs. phonon frequency for the acoustic modes of BeSe throughout the Brillouin zone and compares them with $\overline{e}_{Se}^4$ and $ê_{Be}^4$, given by the dashed lines in each figure. The solid line corresponds to the constant value of $|ê_k^\lambda|^4$ for each atom in elemental materials with two unit cell atoms. At the zone-center $|ê_{Se}^\lambda|^4$ is over 75 times larger than $|ê_{Be}^\lambda|^4$ and grows larger at higher frequencies (and larger wavevector magnitude), while $|ê_{Be}^\lambda|^4$ decays to zero. Like the antimony atoms in BSb, the heavier Se atoms in BeSe give a large enhancement to the isotope scattering through their atomic motion, which helps to give strong isotope scattering and a large isotope effect in BeSe, P=450% at RT.

Figure 27C:
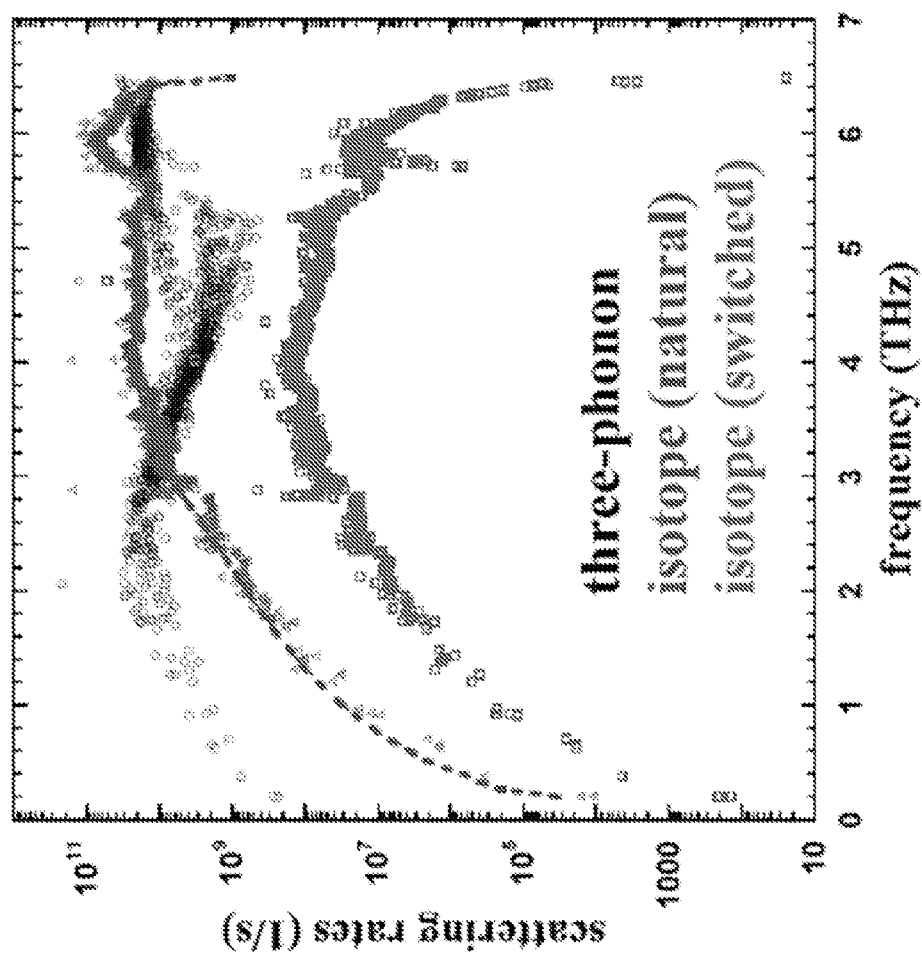
FIG. 27C present calculated acoustic phonon scattering rates vs. frequency for BeSe. The anharmonic phonon-phonon scattering rates are the squares and the phonon-isotope scattering rates are the triangles. The dashed curve passing through the triangles is obtained using the approximate isotope scattering rates. Also shown is the phonon-isotope scattering rate with the mass variance for Se switched to the Be atoms in the calculation given by the green squares.
Figure 27D:
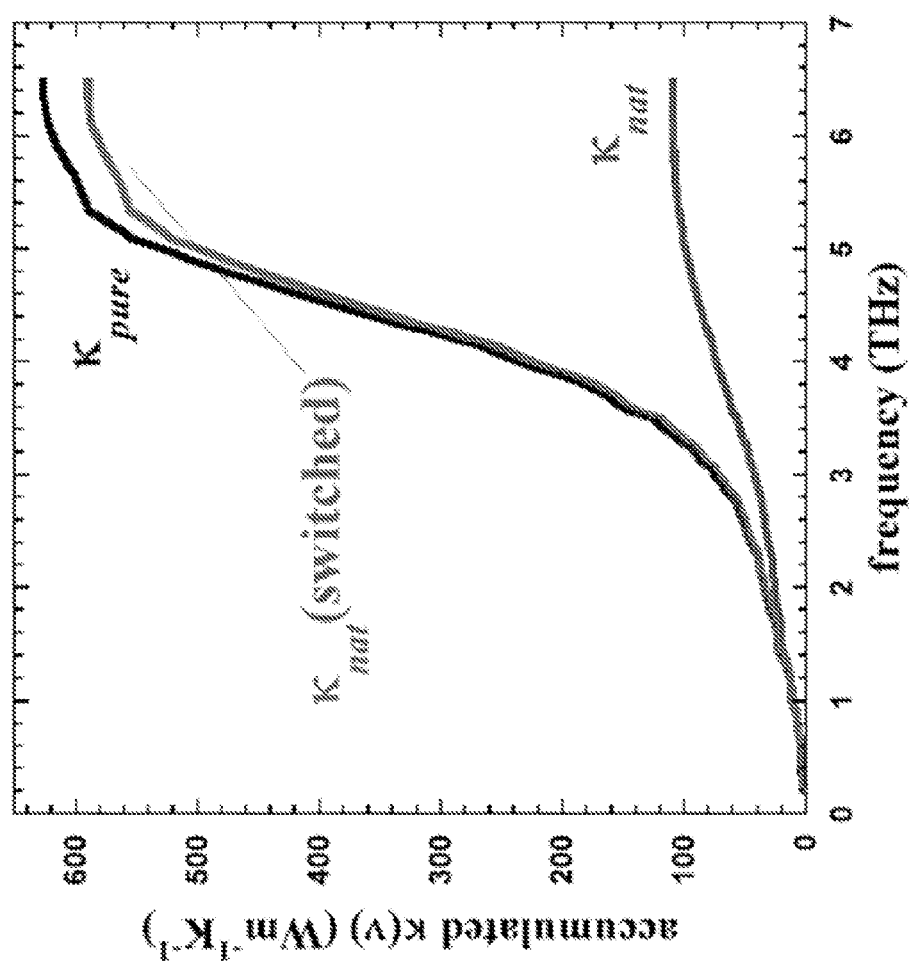
FIG. 27D presents accumulated thermal conductivity, $\kappa_{acc}(\nu)$, vs. frequency for BeSe. $\kappa_{pure}$ and $\kappa_{nat}$ are presented. The calculated $\kappa_{nat}$ using the isotope scattering rates given by the squares in FIG. 27C.

FIG. 27C gives the intrinsic three-phonon scattering rates (circles) and the isotope scattering rates (triangles) vs. frequency, ν, for the acoustic modes of BeSe. For ν<3 THz the RT anharmonic scattering rates are stronger than the isotope scattering rates, due to the strong frequency dependence of the phonon-isotope scattering ($\sim\nu^4$). Above 3 THz, however, the isotope scattering rates are larger than the anharmonic scattering rates, which become weak in this frequency range for reasons discussed below. The dashed blue curve passing through the red triangles is obtained using the approximate isotope scattering rates, Eq. 1. The negligible difference between the two validates the accuracy of this approximation for BeSe. To highlight further the effect of the asymmetric atomic motion on the isotope scattering rates, we also show in FIG. 27C the phonon-isotope scattering rates obtained by artificially switching the mass variance, $g_{Se}$, from the Se atoms to the Be atoms in the calculated isotope scattering rates (green squares). At low frequencies the green squares are 75 times smaller than the normal isotope scattering, and at high frequencies the scattering rates disappear. The scattering rate behavior is evident in the calculated κ of BeSe. FIG. 27D gives the accumulated thermal conductivity, $\kappa_{acc}(\nu)$, as a function of phonon frequency, $\nu$, where $\kappa_{acc}(\nu)$ is given by:

$$\kappa_{acc}(\nu) = \frac{1}{V}\sum_\lambda C_\lambda v_{\lambda\alpha}^2 \tau_{\lambda\alpha}\theta(\nu - \nu_\lambda) \qquad (2)$$

$\theta(\nu-\nu_\lambda)$ is the Heaviside function that is zero for $\nu_\lambda>\nu$ and one for $\nu_\lambda<\nu$. Thus, at a given frequency $\kappa_{acc}(\nu)$ gives the sum of the contributions to κ from all frequencies smaller than $\nu$.

In FIG. 27D, the $k_{pure}$ curve gives the calculated $\kappa_{acc}(\nu)$ for $\kappa_{pure}$ and the $k_{acc}$ curve gives $\kappa_{acc}(\nu)$ for $\kappa_{nat}$ of BeSe. The curves are negligibly different for $\nu<2$ THz where the isotope scattering is very weak. For $\kappa_{pure}$, the largest contributions come from frequencies between 3 THz and 5 THz where the three-phonon scattering rates become weaker with increasing frequency. In contrast, $\kappa_{nat}$ does not have large contributions in this frequency range. Though the three-phonon scattering is weak in this frequency window, the scattering from Se isotopic impurities suppresses $\kappa_{nat}$. Using the isotope scattering rates with the mass variance switched to the Be atoms given by the squares in FIG. 27C gives the $k_{nat}$ curve in FIG. 27D. The much weaker isotope scattering in this case, seen also by comparing the actual $g_{eff}=8.3\times10^{-4}$ to the much smaller value of $2.4\times10^{-6}$ for the hypothetical switched case, gives only a small reduction in κ.

Weak Phonon-Phonon Scattering: A large isotope effect requires both strong isotope scattering and weak anharmonic phonon scattering. Intrinsic phonon-phonon scattering rates are determined by the vibrational properties and by the crystal anharmonicity of each system. These in turn derive from the atomic bonding, atomic masses and the crystal symmetries.

Figure 28:
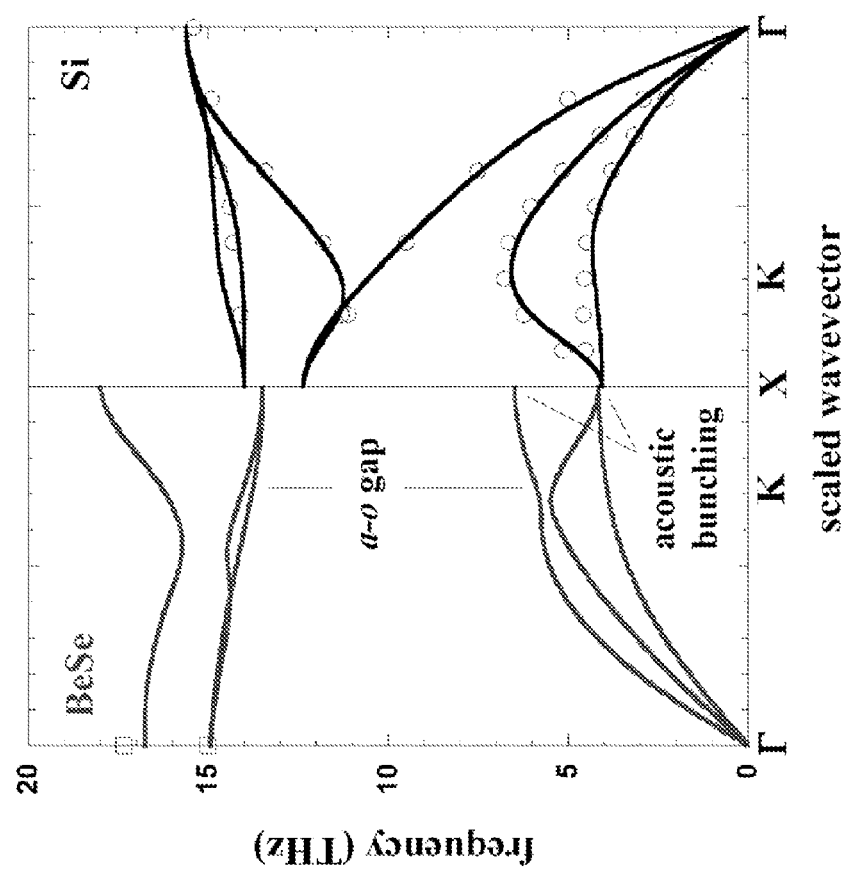
FIG. 28 presents calculated phonon dispersions of BeSe and Si in the Γ→K→X high symmetry direction. The red squares are experimental data for BeSe and the circles are experimental data for Si.
Figure 29:
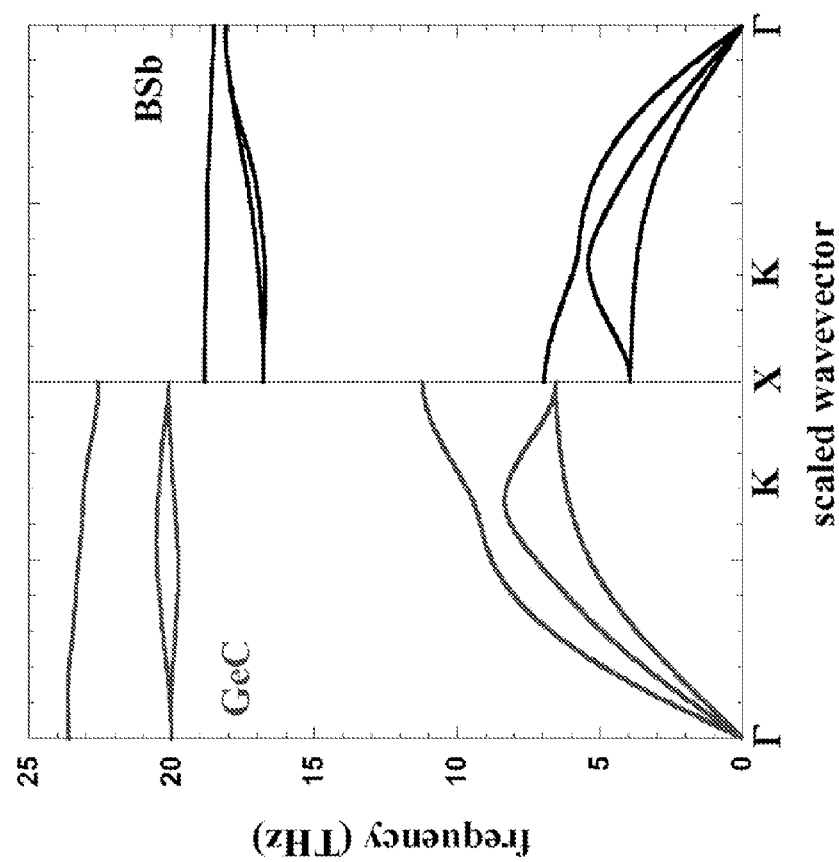
FIG. 29 presents calculated phonon dispersions of GeC and BSb in the Γ→K→X high symmetry direction.

In most materials, acoustic phonons carry the majority of the heat since they have higher group velocities and populations than the optic modes. For acoustic (a) phonons in most materials the dominant anharmonic three-phonon scattering processes involve two acoustic phonons scattering with an optic (o) phonon, aao scattering, or scattering with another acoustic phonon, aaa scattering. Recent first principles calculations have shown that aao scattering channels can be weak in materials with large frequency gaps between the acoustic and the optic phonon branches (a-o gap). In addition, aaa scattering becomes weak when higher frequency acoustic phonon branches are bunched together. The large a-o gap and acoustic branch bunching are highlighted in FIG. 28, which compares a portion of the phonon dispersions of BeSe and Si. These properties can also be seen in the phonon dispersions of GeC and BSb shown in FIG. 29. While Si has no a-o gap, that in BeSe is larger than the highest frequency acoustic phonon. The energy conservation requirement then forbids aao processes in BeSe. The bunching of the three acoustic branches in BeSe is also evident: In the 3 THz to 7 THz range these branches are in much closer proximity than the corresponding acoustic branches for Si. The bunching of acoustic branches is a characteristic of some cubic crystals having light atoms that lack core p orbital groundstates such as beryllium, boron, nitrogen, and carbo. All of the materials considered in here have some degree of acoustic branch bunching, which weakens the higher frequency aaa scattering, especially the resistive Umklapp scattering that involves higher frequency phonons.

The influence of the bunching can be understood qualitatively by noting that in the limit that the acoustic branches coincide, three acoustic phonons cannot simultaneously satisfy energy and momentum conservation, so no aaa scattering is possible.

The trends in κ seen in Table 3 are contrasted with those predicted from conventional criteria. These criteria suggest that compounds with heavier average atomic mass, lower Debye temperatures and larger anharmonicity will have smaller κ. Assuming similar anharmonicities, conventional reasoning would, for example, predict the RT $\kappa_{pure}$ for BeTe to be smaller than that of BeS; instead it is found to be almost twice as large (see Table 3). Similar failures of conventional reasoning are seen in comparing the $\kappa_{pure}$ of BeSe with those of BeO and BeS, and the $\kappa_{pure}$ of GeC with those of SiC. These failures are primarily connected with the fact that these materials have large a-o gaps and varying degrees of acoustic branch bunching, both of which act to push up κ. These properties are not encompassed in the conventional criteria.

The importance of performing the full iterative solution of the phonon BTE when considering high κ materials should be noted. The iterative solution is started by defining an initial approximation for the phonon lifetime, $\tau_{\lambda a}^{(0)}=\tau_\lambda^{anh}$, taken as the inverse of the scattering rates. This gives the relaxation time approximation (RTA), with approximate thermal conductivity, $\kappa^{RTA}$ obtained by using $\tau_{\lambda a}^{(0)}$ instead of $\tau_{\lambda a}$. In the RTA, the N processes are treated as independent resistive processes, which is in principle incorrect since they provide no direct thermal resistance. The iterative procedure corrects for this error giving $\tau_{\lambda a}$ and $\kappa=\kappa^{RTA}+\Delta\kappa$, where $\Delta\kappa>0$. From ab initio calculations of the intrinsic κ for many materials, appreciable U scattering was found to typically occur around and above RT for materials with low to modest RT κ, and in these cases, $\Delta\kappa$ is small indicating that the RTA works well. However, for materials with higher intrinsic κ, $\Delta\kappa$ can become large, and the RTA then gives a poor representation of both the intrinsic κ, and the magnitude of the isotope effect. The last two columns in Table 3 highlight this point by giving the ratio $\kappa_{pure}/\kappa_{pure}^{RTA}$ and $P_{RTA}$, the isotope effect calculated using $\kappa^{RTA}$ instead of κ. For the materials with the largest calculated intrinsic thermal conductivities (diamond, c-BN, GeC, BSb, and BeSe) $\kappa_{pure}$ is 40-60% larger than $\kappa_{pure}^{RTA}$, and $P_{RTA}$ does not provide a good representation of the isotope effects in these materials.

In some embodiments, a method is provided of dissipating heat from a device comprising a heat generating unit disposed on a substrate, a heat spreader in thermal communication with the heat generating unit on one side and a heat sink on the other, and optionally, a thermal interface material to provide a path for heat transfer to heat generated by the heat generating unit, the method includes fabricating at least one of the heat generating unit, substrate, heat spreader, heat sink, or thermal interface material from an unconventional high thermal conductivity compound (including, but not limited to, BAs, BSb, GeC or BeSe) or alloys or composites thereof. In some embodiments, the compound is Boron Arsenide.

In some embodiments, a braking pad includes an unconventional high thermal conductivity compound (including but not restricted to BAs, BSb, GeC and BeSe) or alloy thereof in a composite matrix. In some embodiments, the compound is Boron Arsenide.

In some embodiments, a high thermal conductivity compound of the present disclosure or alloys or composites thereof is provided. In some embodiments, the high thermal conductivity compound is Boron Arsenide. In some embodiments, the high thermal conductivity compound is crystallized in the zinc blende cubic structure. In some embodiments, the high thermal conductivity compound is selected from to BAs, BSb, GeC or BeSe.

In some embodiments, a heat dissipating or heat-conducting element is provided for use in thermal management applications, such as passive cooling of a device having a heat generating element, the heat dissipating or heat-conducting element comprising an unconventional high thermal conductivity compound of the present disclosure or alloys or composites thereof. In some embodiments, the high thermal conductivity compound is Boron Arsenide. In some embodiments, the high thermal conductivity compound is selected from to BAs, BSb, GeC or BeSe. In some embodiments, the heat dissipating element is a heat spreader, heat sink or thermal interface material.

In some embodiments, a device is provided comprising a heat generating unit, such as an electronic device, disposed on a substrate, a heat spreader in thermal communication with the heat generating unit on one side and a heat sink on the other, and optionally, a thermal interface material to provide thermal contact for transfer of heat generated by the heat generating unit, wherein at least one of the heat generating unit, substrate, heat spreader, heat sink, or thermal interface material comprises an unconventional high thermal conductivity compound of the present disclosure or alloys or composites thereof. In some embodiments, the high thermal conductivity compound is Boron Arsenide. In some embodiments, the high thermal conductivity compound is selected from to BAs, BSb, GeC or BeSe.

In some embodiments, a method of dissipating heat from a device is provided, the method comprising a heat generating unit disposed on a substrate, a heat spreader in thermal communication with the heat generating unit on one side and a heat sink on the other, and optionally, a thermal interface material to provide a path for heat transfer to heat generated by the heat generating unit, the method comprising fabricating at least one of the heat generating unit, substrate, heat spreader, heat sink, or thermal interface material from an unconventional high thermal conductivity compound of the present disclosure or alloys or composites thereof. In some embodiments, the high thermal conductivity compound is Boron Arsenide. In some embodiments, the high thermal conductivity compound is selected from to BAs, BSb, GeC or BeSe.

In some embodiments, a braking pad is provided comprising a compound with high thermal conductivity and high hardness, or alloy thereof in a composite matrix. In some embodiments, the unconventional high thermal conductivity compound is Boron Arsenide. In some embodiments, the high thermal conductivity compound is selected from to BAs, BSb, GeC or BeSe.

In some embodiments, a device comprises a heat generating unit and a thermally conductive unit in thermal communication with the heat generating unit for conducting heat generated by the heat generating unit away from the heat generating unit, the thermally conductive unit comprising a thermally conductive compound, alloy or composite thereof.

In some embodiments, a method for dissipating heat comprises fabricating a thermally conductive unit at least in part from a thermally conductive compound, alloy or composite thereof, and positioning the thermally conductive unit in thermal communication with a heat generating unit so that when the heat generating unit generates heat, the thermally conductive unit conducts the heat away from the heat generating unit.

In some embodiments, an electronic device comprises a heat spreader having a first side and a second side opposite the first side; a heat generating unit disposed on the first side of the heat spreader in thermal communication with the heat spreader; and a heat sink disposed on the second side of the heat spreader in thermal communications with the heat spreader, wherein at least one of the heat spreader and the heat sink comprise a thermally conductive compound of the present disclosure, alloy or composite thereof.

In some embodiments, a method of heat dissipating comprises heating a thermally conductive unit comprising a thermally conductive compound of the present disclosure, alloy or composite thereof and allowing the thermally conductive unit to dissipate heat.

In some embodiments, the thermally conductive compound comprises one or more light atoms selected from the group consisting of Beryllium, Boron, Carbon, or Nitrogen and a heavy atom which is between about 4 and about 17 times heavier than the light atom. In some embodiments, the heavy atom is selected from the group consisting of Germanium (Ge), Arsenic (As), Antimony (Sb), Selenium (Se). In some embodiments, the thermally conductive compound is selected from the group consisting of Boron Arsenide (BAs), Boron Antimonide (BSb), Germanium Carbide (GeC) and Beryllium Selenide (BeSe). In some embodiments, the thermally conductive compound is Boron Arsenide (BAs). In some embodiments, the heavy atom of the thermally conductive compound is at least about 70% isotopically pure. In some embodiments, the heavy atom of the thermally conductive compound is at least about 90% isotopically pure.

All patents, patent applications, and published references cited herein are hereby incorporated by reference in their entirety. While the methods of the present disclosure have been described in connection with the specific embodiments thereof, it will be understood that it is capable of further modification. Further, this application is intended to cover any variations, uses, or adaptations of the methods of the present disclosure, including such departures from the present disclosure as come within known or customary practice in the art to which the methods of the present disclosure pertain.

What is claimed is:

1. An electronic device comprising:
   a heat spreader having a first side and a second side opposite the first side;
   a heat generating unit disposed on the first side of the heat spreader in thermal communication with the heat spreader; and
   a heat sink disposed on the second side of the heat spreader in thermal communications with the heat spreader,
   wherein at least one of the heat spreader and the heat sink comprise a high thermal conductivity material having a room temperature thermal conductivity of at least 230 W/mK;
   wherein the high thermal conductivity material comprises one or more light atoms and a heavy atom,
   wherein the one or more light atoms are selected from the group consisting of Beryllium (Be), Boron (B), Carbon (C), and Nitrogen (N);
   wherein the heavy atom element is selected from the group consisting of Arsenic (As), Gallium (Ga), Antimony (Sb), Selenium (Se), Vanadium (V), Yttrium (Y), Niobium (Nb), Tantalum (Ta), Chromium (Cr), Molybdenum (Mo), and Zirconium (Zr); and wherein the heavy atom is between 4 and 17 times heavier than the light atom.

2. The electronic device of claim 1, wherein the high thermal conductivity material is cubic Boron Arsenide (BAs).

3. The electronic device of claim 1, wherein the heavy atom is at least 70% isotopically pure.

4. The electronic device of claim 1, wherein the heavy atom is at least 90% isotopically pure.

5. An electronic device comprising:
- a heat spreader having a first side and a second side opposite the first side;
- a heat generating unit disposed on the first side of the heat spreader in thermal communication with the heat spreader; and
- a heat sink disposed on the second side of the heat spreader in thermal communications with the heat spreader,
- wherein at least one of the heat spreader and the heat sink comprise a high thermal conductivity material;
- wherein the high thermal conductivity material is Boron Antimonide (BSb) or Beryllium Selenide (BeSe).

* * * * *